(12) United States Patent
Van Brunt et al.

(10) Patent No.: US 10,998,418 B2
(45) Date of Patent: May 4, 2021

(54) POWER SEMICONDUCTOR DEVICES HAVING REFLOWED INTER-METAL DIELECTRIC LAYERS

(71) Applicant: Cree, Inc., Durham, NC (US)

(72) Inventors: Edward R. Van Brunt, Raleigh, NC (US); Daniel J. Lichtenwalner, Raleigh, NC (US); Shadi Sabri, Cary, NC (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 16/413,921

(22) Filed: May 16, 2019

(65) Prior Publication Data

US 2020/0365708 A1 Nov. 19, 2020

(51) Int. Cl.
*H01L 29/51* (2006.01)
*H01L 29/06* (2006.01)
*H01L 29/16* (2006.01)
*H01L 29/66* (2006.01)
(Continued)

(52) U.S. Cl.
CPC ........ *H01L 29/517* (2013.01); *H01L 29/0696* (2013.01); *H01L 29/1608* (2013.01); *H01L 29/66333* (2013.01); *H01L 29/66712* (2013.01); *H01L 29/7395* (2013.01); *H01L 29/7802* (2013.01)

(58) Field of Classification Search
CPC .......... H01L 29/1608; H01L 29/66333; H01L 29/66712; H01L 29/0696; H01L 29/7395; H01L 29/7802; H01L 29/12; H01L 29/408; H01L 29/1095; H01L 29/7811; H01L 29/7813; H01L 29/41775; H01L 29/41741; H01L 29/417; H01L 29/66068; H01L 21/02129
See application file for complete search history.

(56) References Cited

U.S. PATENT DOCUMENTS

| 5,930,630 | A | 7/1999 | Hsieh et al. |
| 6,184,555 | B1 * | 2/2001 | Tihanyi ............... H01L 29/0634 257/342 |
| 10,014,258 | B2 * | 7/2018 | Yamada ............... H01L 21/043 |

(Continued)

FOREIGN PATENT DOCUMENTS

| CN | 104867832 | 10/2017 |
| EP | 0540321 | 5/1993 |

(Continued)

OTHER PUBLICATIONS

International Search Report and the Written Opinion of the International Searching Authority corresponding to International Patent Application No. PCT/US2020/030926 (21 pages) (dated Jul. 7, 2020).

*Primary Examiner* — Khiem D Nguyen
(74) *Attorney, Agent, or Firm* — Myers Bigel, P.A.

(57) ABSTRACT

Power semiconductor devices include multi-layer inter-metal dielectric patterns that include at least one reflowed dielectric material pattern and at least one non-reflowable dielectric material pattern. In other embodiments, power semiconductor devices include reflowed inter-metal dielectric patterns that are formed using sacrificial structures such as dams to limit the lateral spread of the reflowable dielectric material of the inter-metal dielectric pattern during the reflow process. The inter-metal dielectric patterns may have improved shapes and performance.

18 Claims, 16 Drawing Sheets

(51) Int. Cl.
*H01L 29/739* (2006.01)
*H01L 29/78* (2006.01)

(56) References Cited

U.S. PATENT DOCUMENTS

| | | | |
|---|---|---|---|
| 10,418,445 B2* | 9/2019 | Ryo | H01L 29/0623 |
| 2012/0171850 A1* | 7/2012 | Honaga | H01L 29/66068 |
| | | | 438/478 |
| 2012/0299094 A1* | 11/2012 | Lee | H01L 29/7827 |
| | | | 257/341 |
| 2014/0197422 A1* | 7/2014 | Wada | H01L 29/6606 |
| | | | 257/77 |
| 2015/0008478 A1* | 1/2015 | Cheng | H01L 21/263 |
| | | | 257/139 |
| 2015/0087125 A1* | 3/2015 | Nishio | H01L 29/66068 |
| | | | 438/285 |
| 2016/0087044 A1* | 3/2016 | Iijima | H01L 29/7802 |
| | | | 257/77 |
| 2016/0197149 A1* | 7/2016 | Sakai | H01L 21/0475 |
| | | | 257/77 |
| 2017/0263746 A1* | 9/2017 | Tashima | H01L 29/66712 |
| 2017/0345891 A1* | 11/2017 | Van Brunt | H01L 29/7802 |
| 2017/0352733 A1 | 12/2017 | Hoshi et al. | |
| 2018/0083112 A1* | 3/2018 | Shimizu | H01L 29/0619 |
| 2018/0315842 A1* | 11/2018 | Tawara | H01L 29/1608 |

FOREIGN PATENT DOCUMENTS

| | | | |
|---|---|---|---|
| GB | 2087648 | 5/1982 | |
| JP | 62185375 | 8/1987 | |
| JP | 2008-192691 A * | 8/2008 | H01L 29/12 |
| JP | 2008192691 | 8/2008 | |

* cited by examiner

POWER SEMICONDUCTOR DEVICES HAVING REFLOWED INTER-METAL DIELECTRIC LAYERS

FIELD

The present invention relates to semiconductor devices and, more particularly, to power semiconductor devices.

BACKGROUND

Power semiconductor devices are used to carry large currents and support high voltages. A wide variety of power semiconductor devices are known in the art including, for example, power Metal Oxide Semiconductor Field Effect Transistors ("MOSFETs"), Insulated Gate Bipolar Transistors ("IGBTs") and various other devices. These power semiconductor devices are generally fabricated from wide bandgap semiconductor materials such as silicon carbide or gallium nitride based materials (herein, the term "wide bandgap semiconductor" encompasses any semiconductor having a bandgap of at least 1.4 eV). Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential.

Power semiconductor devices can have a lateral structure or a vertical structure. In a device having a lateral structure, the terminals of the device (e.g., the drain, gate and source terminals for a power MOSFET) are on the same major surface (i.e., upper or lower) of a semiconductor layer structure. In contrast, in a device having a vertical structure, at least one terminal is provided on each major surface of the semiconductor layer structure (e.g., in a vertical MOSFET, the source and gate may be on the upper surface of the semiconductor layer structure and the drain may be on the bottom surface of the semiconductor layer structure). Vertical structures are typically used in very high power applications, as the vertical structure allows for a thick semiconductor drift layer that can support high current densities and block high voltages. Herein, the term "semiconductor layer structure" refers to a structure that includes one or more semiconductor layers such as semiconductor substrates and/or semiconductor epitaxial layers.

A conventional vertical silicon carbide power MOSFET includes an epitaxial layer structure that is formed on a silicon carbide substrate, such as a silicon carbide wafer. The epitaxial layer structure (which may comprise one or more separate layers) functions as a drift region of the power semiconductor device. The MOSFET may have an active region that is formed on and/or in the drift region in which one or more semiconductor devices are formed, as well as a termination region that may surround the active region. The active region acts as a main junction for blocking voltage in the reverse bias direction and providing current flow in the forward bias direction. The power MOSFET typically has a unit cell structure, meaning that the active region includes a large number of individual "unit cell" MOSFETs that are electrically connected in parallel to function as a single power MOSFET. In high power applications, such a device may include thousands or tens of thousands of unit cells.

SUMMARY

Pursuant to embodiments of the present invention, semiconductor devices are provided that include a wide bandgap semiconductor layer structure, a gate electrode structure on an upper surface of the wide bandgap semiconductor layer structure, an inter-metal dielectric pattern on the gate electrode structure, the inter-metal dielectric pattern including a non-reflowable dielectric material pattern and a reflowed dielectric material pattern, and a source metallization structure on the inter-metal dielectric pattern. The gate electrode structure is between the wide bandgap semiconductor layer structure and the inter-metal dielectric pattern and the inter-metal dielectric pattern is between the gate electrode structure and the source metallization structure.

In some embodiments, the non-reflowable dielectric material pattern is between the gate electrode structure and the reflowed dielectric material pattern.

In some embodiments, a minimum thickness of the non-reflowable dielectric material pattern may be selected to be sufficient to avoid breakdown of the inter-metal dielectric pattern during normal operation of the semiconductor device.

In some embodiments, a thickness of an upper corner of the non-reflowable dielectric material pattern may be selected to be sufficient to avoid breakdown of the inter-metal dielectric pattern during normal operation of the semiconductor device.

In some embodiments, the gate electrode structure may comprise a plurality of gate fingers that are separated from the wide bandgap semiconductor layer structure by respective ones of a plurality of gate insulating fingers, and the non-reflowable dielectric material pattern may comprise a plurality of non-reflowable dielectric fingers that conformally surround upper and side surfaces of the respective gate fingers.

In some embodiments, the reflowed dielectric material pattern may have a rounded cross-section.

In some embodiments, a ratio of a thickness of the inter-metal dielectric pattern above the center of a top surface of a gate finger of the gate electrode structure to a minimum thickness of the inter-metal dielectric pattern may be less than 4-to-1.

In some embodiments, a portion of the reflowed dielectric material pattern that is adjacent an upper corner of the non-reflowable dielectric material pattern may be a portion of the reflowed dielectric material pattern that has a minimum thickness.

In some embodiments, the reflowed dielectric material pattern may comprise a boro-phospho-silicate glass ("BPSG") pattern.

In some embodiments, the semiconductor device may be a MOSFET, where a plurality of source regions are provided in the wide bandgap semiconductor layer structure, the source metallization pattern is electrically connected to the source regions, and the device further includes a drain contact on the wide bandgap semiconductor layer structure opposite the source metallization structure.

In some embodiments, the source metallization structure may be a diffusion barrier layer and a metal source contact layer on the diffusion barrier layer.

In some embodiments, the semiconductor device may be an insulated gate bipolar junction transistor.

In some embodiments, the reflowed dielectric material pattern may be between the gate electrode structure and the non-reflowable dielectric material pattern.

Pursuant to further embodiments of the present invention, semiconductor devices are provided that include a wide bandgap semiconductor layer structure, a gate electrode structure on an upper surface of the wide bandgap semiconductor layer structure, an inter-metal dielectric pattern on the gate electrode structure, the inter-metal dielectric pattern comprising a reflowed dielectric material pattern, and a source metallization structure on the inter-metal dielectric pattern. A lower portion of the reflowed dielectric material pattern has substantially vertical sidewalls.

In some embodiments, an upper portion of the reflowed dielectric material pattern may have a rounded cross-section.

In some embodiments, the gate electrode structure may comprise a plurality of gate fingers that are separated from the wide bandgap semiconductor layer structure by respective ones of a plurality of gate insulating fingers.

In some embodiments, the gate insulating fingers may have a first thickness in a direction perpendicular to the upper surface of the wide bandgap semiconductor layer structure, and the lower portion of the reflowed dielectric material pattern may have a second thickness that is greater than or equal to the first thickness.

In some embodiments, a thickness of the lower portion of the reflowed dielectric material pattern may be at least 0.1 microns.

In some embodiments, the gate electrode structure may be between the wide bandgap semiconductor layer structure and the inter-metal dielectric pattern, and the inter-metal dielectric pattern may between the gate electrode structure and the source metallization structure.

In some embodiments, the reflowed dielectric material pattern may comprise a boro-phospho-silicate glass ("BPSG") pattern.

In some embodiments, a ratio of a thickness of the inter-metal dielectric pattern above the center of a top surface of a gate finger of the gate electrode structure to a minimum thickness of the inter-metal dielectric pattern may be at least 1-to-1 and less than 4-to-1.

Pursuant to further embodiments of the present invention, methods of fabricating a semiconductor device are provided in which a wide bandgap semiconductor layer structure is formed. A conductive pattern is formed on an upper surface of the wide bandgap semiconductor layer structure. A non-reflowable dielectric material pattern is formed on the conductive pattern. A reflowable dielectric material layer that includes reflowable dielectric material is formed on the conductive pattern. The reflowable dielectric material is reflowed. A source metallization structure is formed on an inter-metal dielectric pattern, the inter-metal dielectric pattern including the non-reflowable dielectric material pattern and a reflowed dielectric material pattern that includes at least some of the reflowable dielectric material.

In some embodiments, the non-reflowable dielectric material pattern may be between the conductive pattern and the reflowed dielectric material pattern.

In some embodiments, the reflowed dielectric material pattern may be between the conductive pattern and the non-reflowable dielectric material pattern.

In some embodiments, the method may further include reflowing the reflowable dielectric material layer that includes reflowable dielectric material to form a reflowed dielectric material layer, and then etching the reflowed dielectric material layer to form the reflowed dielectric material pattern.

In some embodiments, the method may further include etching the reflowable dielectric material layer that includes reflowable dielectric material to form a reflowable dielectric material pattern, and then reflowing the reflowable dielectric material pattern to form the reflowed dielectric material pattern.

In some embodiments, the conductive pattern may comprise a plurality of gate fingers.

In some embodiments, forming the non-reflowable dielectric material pattern may comprise conformally forming a non-reflowable dielectric finger on each of the respective gate fingers.

In some embodiments, the reflowed dielectric material pattern may be a boro-phospho-silicate glass pattern.

In some embodiments, the non-reflowable dielectric material pattern may be formed on sidewalls of the gate fingers.

In some embodiments, the reflowed dielectric material pattern may directly contact sidewalls of the gate fingers.

In some embodiments, the conductive pattern may comprise a semiconductor pattern, and forming the non-reflowable dielectric material pattern on the conductive pattern may comprise oxidizing exposed surfaces of the semiconductor pattern.

In some embodiments, the semiconductor pattern may comprise a plurality of polysilicon gate fingers, and the wide bandgap semiconductor layer structure may comprise a silicon carbide semiconductor layer structure.

In some embodiments, the method may further include forming respective sacrificial structures in gaps that are defined between adjacent ones of the gate fingers, the sacrificial structures positioned to limit lateral spreading of the reflowable dielectric material during the reflowing of the reflowable dielectric material.

In some embodiments, a minimum thickness of the non-reflowable dielectric material pattern may be selected to be sufficient to avoid breakdown of the inter-metal dielectric pattern during normal operation of the semiconductor device.

In some embodiments, a thickness of an upper corner of the non-reflowable dielectric material pattern may be selected to be sufficient to avoid breakdown of the inter-metal dielectric pattern during normal operation of the semiconductor device.

In some embodiments, the reflowed dielectric material pattern may have a rounded cross-section.

In some embodiments, a ratio of a thickness of the inter-metal dielectric pattern above the center of a top surface of a gate finger of the conductive pattern to the minimum thickness of the inter-metal dielectric pattern may be less than 4-to-1.

Pursuant to still further embodiments of the present invention, methods of fabricating a semiconductor device are provided in which a wide bandgap semiconductor layer structure is formed, and a plurality of spaced-apart gate fingers are then formed on an upper surface of the wide bandgap semiconductor layer structure. A reflowable dielectric material layer is formed that includes reflowable dielectric material on the gate fingers. Sacrificial structures are formed on the wide bandgap semiconductor layer structure in gaps between the gate fingers. The reflowable dielectric material is reflowed. A source metallization pattern is formed on an inter-metal dielectric pattern, the inter-metal dielectric pattern including a reflowed dielectric material pattern that includes at least some of the reflowable dielectric material.

In some embodiments, forming the reflowable dielectric material layer on the gate fingers may comprise conformally forming the reflowable dielectric material layer on each of the respective gate fingers.

In some embodiments, the reflowed dielectric material pattern may be a boro-phospho-silicate glass pattern.

In some embodiments, the gate fingers may comprise polysilicon gate fingers, and the wide bandgap semiconductor layer structure may comprise a silicon carbide semiconductor layer structure.

In some embodiments, the sacrificial structures may be positioned to limit lateral spreading of the reflowable dielectric material during the reflowing the reflowable dielectric material.

In some embodiments, the method may further include removing the sacrificial structures.

In some embodiments, a lower portion of the reflowed dielectric material pattern may have substantially vertical sidewalls, and an upper portion of the reflowed dielectric material pattern may have a rounded cross-section.

Pursuant to further embodiments of the present invention, semiconductor devices are provided that include a wide bandgap semiconductor layer structure, a gate electrode structure on an upper surface of the wide bandgap semiconductor layer structure, an inter-metal dielectric pattern on the gate electrode structure, the inter-metal dielectric pattern including at least a first silicon oxide pattern and a second silicon oxide pattern that comprises a different material than the first silicon oxide pattern, and a source metallization structure on the inter-metal dielectric pattern. The gate electrode structure is between the wide bandgap semiconductor layer structure and the inter-metal dielectric pattern, the inter-metal dielectric pattern is between the gate electrode structure and the source metallization structure, and a ratio of a maximum thickness of the inter-metal dielectric pattern to a minimum thickness of the inter-metal dielectric pattern is less than 4-to-1.

In some embodiments, the first silicon oxide pattern may comprise a non-reflowable material pattern and the second silicon oxide pattern may comprise a reflowed material pattern.

In some embodiments, the minimum thickness of the inter-metal dielectric pattern may be adjacent an upper corner of the gate electrode structure.

In some embodiments, the maximum thickness of the inter-metal dielectric pattern may be above the center of a top surface of a gate finger of the gate electrode structure.

In some embodiments, the ratio of the maximum thickness of the inter-metal dielectric pattern a to a minimum thickness of the inter-metal dielectric pattern may be more than 1-to-1.

In some embodiments, the ratio of the thickness of the inter-metal dielectric pattern above the center of a top surface of a gate finger of the gate electrode structure to a minimum thickness of the inter-metal dielectric pattern may be more than 1-to-1.

In some embodiments, the minimum thickness of the inter-metal dielectric pattern may be adjacent an upper corner of the gate electrode structure.

DETAILED DESCRIPTION

Figure 1:
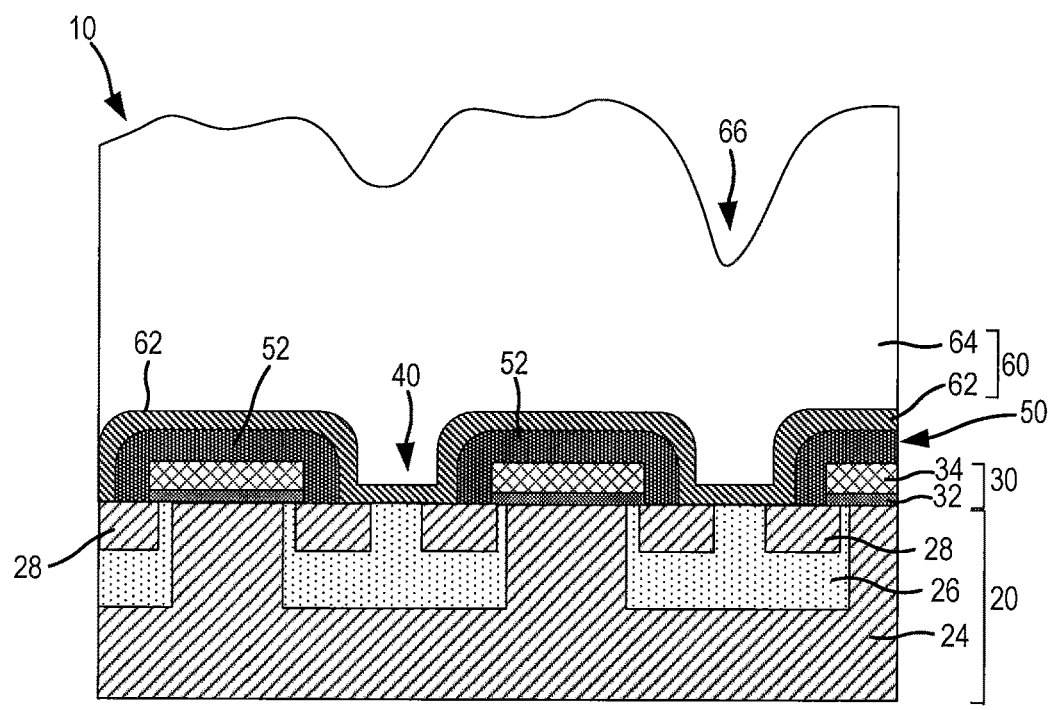
FIG. 1 is a schematic cross-sectional view of the top-side source metallization structure for several unit cells of a power MOSFET.

A power semiconductor device such as a power MOSFET or a power IGBT includes a top-side metallization structure that is used to connect terminals of the device to external structures. For example, a vertical power MOSFET includes a semiconductor layer structure, a top-side source metallization structure that acts as the source terminal of the device, a top-side gate metallization structure that acts as the gate terminal of the device, and a "back-side" drain metallization structure that is formed on the bottom of the device that acts as the drain terminal for the MOSFET. FIG. 1 is a schematic cross-sectional view of an upper portion of a few unit cells of a conventional power MOSFET 10.

As shown in FIG. 1, the conventional power MOSFET 10 includes a semiconductor layer structure 20 (only the top portion of the semiconductor layer structure 20 is shown in FIG. 1), a gate electrode structure 30, an inter-metal dielectric pattern 50 and a top-side source metallization structure 60 that is formed on the upper surfaces of the semiconductor layer structure 20 and the gate electrode structure 30. The semiconductor layer structure 20 may comprise, for example, a silicon carbide semiconductor substrate (not shown) that has a silicon carbide drift region 24 epitaxially grown thereon. Well regions 26 that have the opposite conductivity type of the drift region 24 are formed in the upper surface of the drift region 24. Source regions 28 are formed within the well regions 26. While not shown in FIG. 1, a drain contact is formed on the bottom surface of the semiconductor layer structure 20.

The gate electrode structure 30 includes a plurality of gate fingers 34 that are formed on an upper surface of the semiconductor layer structure 20. Each gate finger 34 may comprise a bar-shaped semiconductor or metal pattern, and the gate fingers 34 may extend in parallel to each other. The gate electrode structure 30 further includes a plurality of gate insulating fingers 32 that are formed between each respective gate finger 34 and the upper surface of the semiconductor layer structure 20 to insulate the gate fingers 34 from the semiconductor layer structure 20. The gate insulating fingers 32 may comprise strips of silicon oxide. The inter-metal dielectric pattern 50 includes a plurality of dielectric fingers 52 and is formed on the upper surface of the semiconductor layer structure 20 after formation of the gate insulating fingers 32 and the gate fingers 34. Each dielectric finger 52 may cover the sidewalls and upper surface of a respective one of the gate insulating fingers 32 and a respective one of the gate fingers 34. Gaps 40 are provided between adjacent dielectric fingers 52 that expose the source regions 28 in the upper surface of the semiconductor layer structure 20. The pitch between adjacent dielectric fingers 52 may be small, and hence the gaps 40 have corresponding narrow widths such as, for example, 1-5 microns.

The top-side source metallization structure 60 includes an electrically conducting diffusion barrier layer 62 and a metal source contact layer 64. The diffusion barrier layer 62 may be formed conformally on the inter-metal dielectric pattern 50 and the exposed well regions 26 and source regions 28 in the upper surface of the semiconductor layer structure 20. The diffusion barrier layer 62 may be designed to be a reasonably good conductor which can prevent materials such as, for example, wet etchants from diffusing into the inter-metal dielectric pattern 50. The source contact layer 64 may comprise a high conductivity metal layer. Depressions 66 that are referred to as "keyholes" may be present in the upper surface of the source contact layer 64 above some or all of the gaps 40.

Chemicals such as wet etchants may be applied to the source contact layer 64 during fabrication of the MOSFET 10. It may be difficult to completely rinse away the wet etchants, particularly if the upper surface of the source contact layer 64 includes deep keyholes 66. Any remaining wet etchants (or other corrosive materials) may potentially diffuse deep into the top-side source metallization structure 60 along grain boundaries of the source metal. While the conductive diffusion barrier layer 62 will typically prevent chemicals that reach the bottom of the source contact layer 64 from diffusing any farther, small voids may be present in the diffusion barrier layer 62, particularly within the gaps 40, since the diffusion barrier layer metal may not always fully fill the narrow gaps 40. If voids are present in the diffusion barrier layer 62, the chemicals may pass through the voids and then attack the inter-metal dielectric pattern 50. If the inter-metal dielectric pattern 50 includes seams or other passageways, the chemicals may travel along and/or expand the seams, creating a pathway between the top-side source metallization structure 60 and a gate finger 34. This can potentially generate an electrical short circuit between the top-side source metallization structure 60 and a gate finger 34. Such an electrical short in even a single unit cell may result in damage or the destruction of the MOSFET 10.

Figure 2:
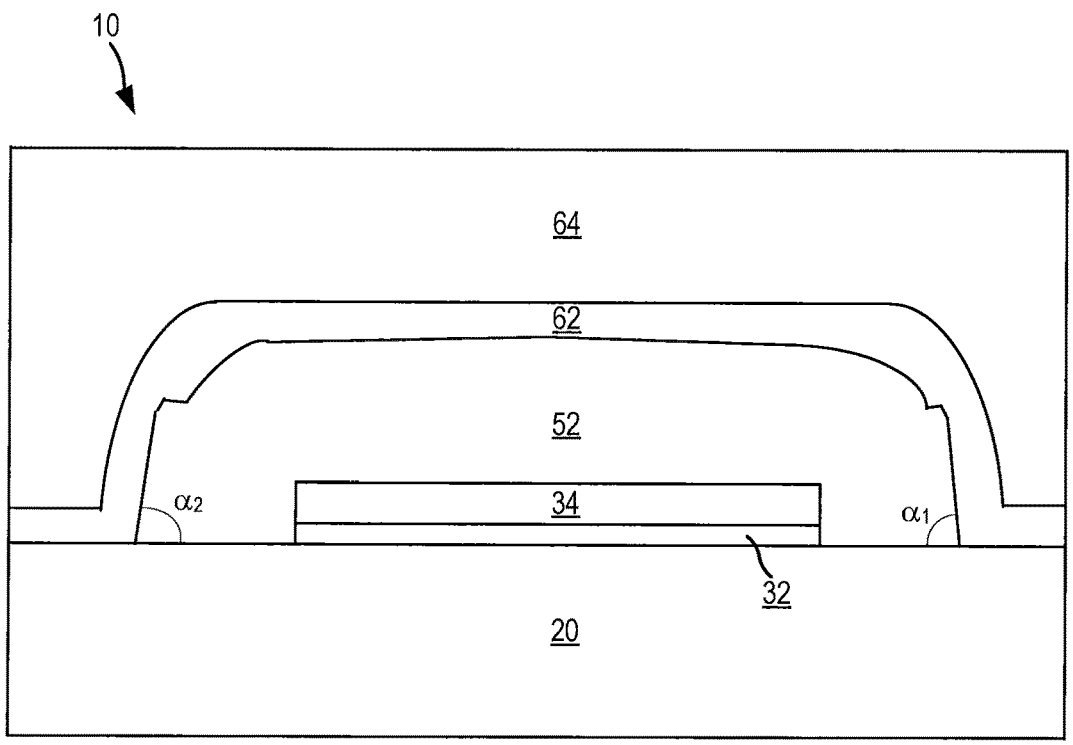
FIG. 2 is an enlarged cross-sectional view of one of the gate fingers and surrounding structures of the MOSFET of FIG. 1.

FIG. 2 is an enlarged cross-sectional view of one of the gate fingers 34 of the MOSFET 10 of FIG. 1 that is drawn to scale. As shown in FIG. 2, a dielectric finger 52 of the inter-metal dielectric pattern 50 is formed substantially conformally on the gate finger 34 and the underlying gate insulating finger 32. The sidewalls of the dielectric finger 52 and the upper surface of the semiconductor layer structure 20 define a pair of inwardly facing angles $\alpha_1$ and $\alpha_2$. As shown in FIG. 2, angles $\alpha_1$ and $\alpha_2$ may each be close to 90°. In the depicted embodiment, which is typical, the angles $\alpha_1$ and $\alpha_2$ are each about 80°, and hence the sidewalls of the gaps 40 extend upwardly at angles of about 100°. When the sidewalls of the gaps 40 have such sharp angles, it may be difficult to completely fill the gaps 40, which may result in the formation of voids in the diffusion barrier layer 62, as discussed above.

Figure 3:
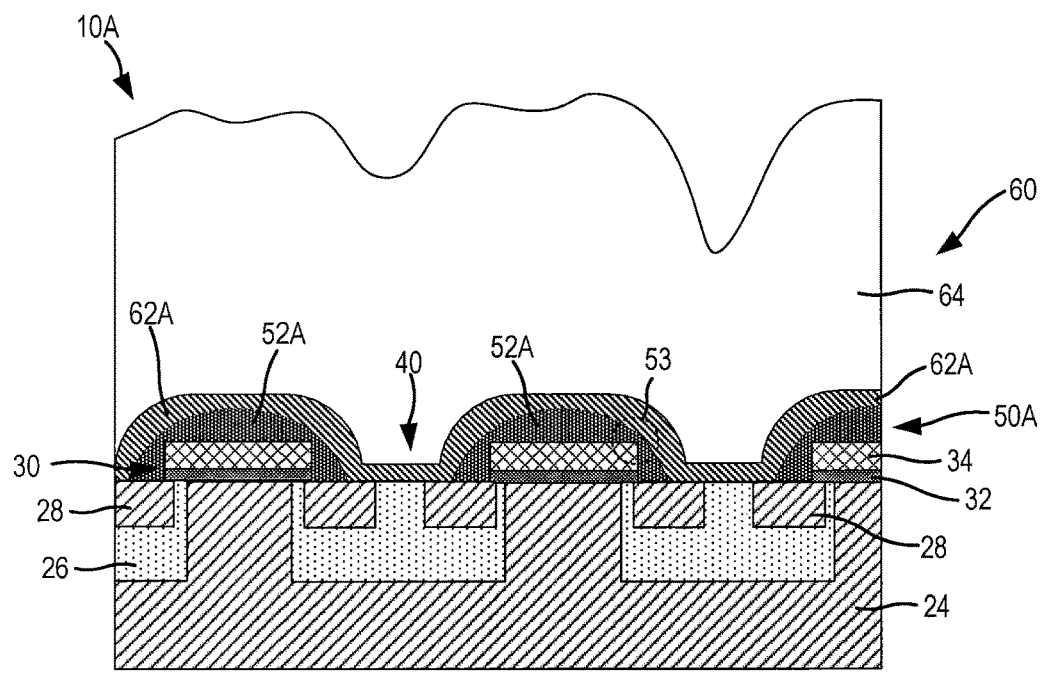
FIG. 3 is a schematic cross-sectional view of the top-side source metallization structure for several unit cells of a power MOSFET that is formed using a reflowable inter-metal dielectric pattern.

FIG. 3 is a schematic cross-sectional view of a portion of a MOSFET 10A that is a modified version of the MOSFET 10 of FIG. 1 that includes an inter-metal dielectric pattern 50A that has a different shape than the inter-metal dielectric pattern 50 of the MOSFET 10 of FIG. 1. Referring to FIG. 3, one technique for reducing the likelihood that voids form in the diffusion barrier layer 62 is to decrease the size of the angles $\alpha_1$ and $\alpha_2$, thereby increasing the angles that the sidewalls of the gaps 40 define with the upper surface of the semiconductor layer structure 20. As the angles defined by the sidewalls of the gaps 40 are increased, it becomes easier for the diffusion barrier layer metal to fill the gaps 40 without the formation of voids. As shown in FIG. 3, one way of decreasing the size of the angles $\alpha_1$ and $\alpha_2$ (and hence increasing the angles defined by the sidewalls of the gaps 40) is to use a reflowable dielectric material, such as boro-phospho-silicate glass ("BPSG"), to conformally form a reflowable inter-metal dielectric pattern (not shown in FIG. 3), on the top surfaces and sidewalls of the gate electrode structure 30. After the BPSG inter-metal dielectric pattern is conformally formed on the gate electrode structure 30, it may be reflowed at an elevated temperature (e.g., temperatures between 500-1000° C.) to provide a reflowed inter-metal dielectric pattern 50A. The reflow process may increase the density of the dielectric material, which tends to reduce or eliminate seams in the material. Additionally, surface tension in the reflowed BPSG material may result in the individual dielectric fingers 52A that form the reflowed inter-metal dielectric pattern 50A having a generally semi-oval or semi-circular cross-section, as shown in FIG. 3. This generally "rounded" profile may reduce the angles at and $\alpha_2$, which may make it easier to form a diffusion barrier layer 62A in the gaps 40 without the formation of significant voids.

While forming the inter-metal dielectric pattern 50A using a reflowable dielectric material may significantly improve the gap-fill characteristics of the diffusion barrier layer 62A (and hence reduce void formation therein), the thickness of the reflowed BPSG material that covers each gate finger 34 is not uniform. In particular, as shown in FIG. 3, the thickness of the reflowed BPSG material may have a maximum thickness above the middle of the top surface of the gate finger 34, and may be significantly thinner adjacent the side edges of the top surface of the gate finger 34. In some cases, the thickness of the reflowed inter-metal dielectric pattern SOA adjacent the top side edges of the gate fingers 34 (see the region 53 in FIG. 3) may have a thickness that is only 10-40% as thick as the thickness of the reflowed BPSG material above the middle of the top surface of the gate finger 34. Additionally, the reflow process may tend to extend the lateral width of each dielectric finger 52A, which reduces the widths of the gaps 40. The thin upper "corner" regions of the reflowed dielectric fingers 52A may be vulnerable to breakdown during device operation, which can result in a short-circuit between the gate finger 34 and the source metallization structure 60, which can result in failure of the device. Additionally, the smaller gaps 40 may increase the source contact resistance and/or increase the likelihood that voids form during the deposition of the diffusion barrier layer 62A. Thus, while the use of a reflowable inter-metal dielectric pattern 50A may solve one problem, it may raise other issues.

Pursuant to certain embodiments of the present invention, power semiconductor devices are provided that include multi-layer inter-metal dielectric patterns that include at least one reflowable dielectric material pattern and at least one non-reflowable dielectric material pattern. The non-reflowable dielectric material pattern may be formed on the exposed top surfaces of the gate fingers and on the exposed side surfaces of the gate insulating fingers and the gate fingers. The reflowable dielectric material pattern may be formed on the non-reflowable dielectric material pattern. Alternatively, reflowable dielectric material pattern may be formed on the exposed top surfaces of the gate fingers and on the exposed side surfaces of the gate insulating fingers and the gate fingers. The reflowable dielectric material pattern may then be reflowed to form a reflowed dielectric material pattern, and the non-reflowable dielectric material pattern may be formed on the reflowed dielectric material pattern.

In either case, the non-reflowable dielectric material pattern may have a thickness, for example, that is sufficient to prevent breakdown of the inter-metal dielectric pattern. Thus, even if the thickness of the reflowable dielectric material pattern adjacent the upper corners of the gate fingers is reduced significantly during the reflow process, there will still be a sufficient total thickness of dielectric material to avoid breakdown. Moreover, the combination of the non-reflowable dielectric material pattern and the reflowable dielectric material pattern may have a thickness that is about the same as the thickness of the reflowable dielectric material pattern in the embodiment of FIG. 3. Consequently, the reflowable dielectric material pattern may have a reduced thickness, and hence during reflow it will not spread as far into the gaps between adjacent gate fingers. Thus, the inter-metal dielectric patterns according to embodiments of the present invention may have the advantages of a fully reflowable inter-metal dielectric pattern while reducing or minimizing the potential disadvantages associated with a fully reflowable inter-metal dielectric pattern.

Pursuant to further embodiments of the present invention, power semiconductor devices are provided that include reflowed inter-metal dielectric patterns that are formed using sacrificial structures such as dams to limit the lateral spread of the reflowable dielectric material of the inter-metal dielectric pattern during the reflow process. The use of such dams may also increase the amount of dielectric material along the side edges of the gate fingers, ensuring that the inter-metal dielectric pattern has a sufficient minimum thickness to avoid breakdown of the inter-metal dielectric pattern. The sacrificial dams may also prevent lateral spread of the reflowable dielectric materials, thereby maintaining the size of the gaps between adjacent dielectric fingers.

The inter-metal dielectric pattern may comprise a multi-layer inter-metal dielectric pattern having, for example, both a non-reflowable layer and a reflowable layer. A ratio of a maximum thickness of the inter-metal dielectric pattern to a minimum thickness of the inter-metal dielectric pattern is less than 8-to-1 in some embodiments, less than 6-to-1 in other embodiments, and less than 4-to-1 in still further embodiments. In each case, the ratio of the maximum thickness of the inter-metal dielectric pattern to the minimum thickness of the inter-metal dielectric pattern is be at least 1-to-1.

While the discussion herein focuses on power MOSFET devices, it will be appreciated that the techniques disclosed herein are not limited to such devices. For example, the techniques disclosed herein may also be used in IGBT devices.

Embodiments of the present invention will now be discussed in further detail with reference to FIGS. 4-13, in which example embodiments of the invention are shown.

Figure 4:
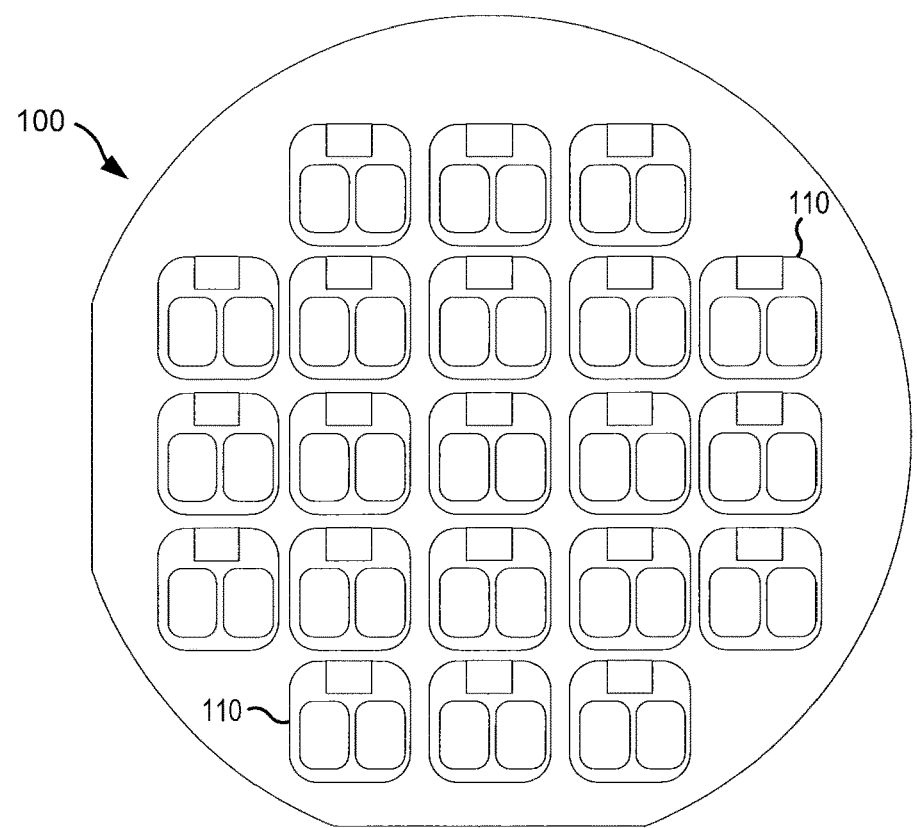
FIG. 4 is a schematic plan view of a semiconductor wafer that includes a plurality of power MOSFETs according to embodiments of the present invention.

FIG. 4 is a schematic plan view of a semiconductor wafer 100 that includes a plurality of power MOSFETs 110 according to embodiments of the present invention. The power MOSFETs 110 may be formed in rows and columns and may be spaced apart from each other so that the wafer 100 may later be singulated (e.g., diced) to separate the individual power MOSFETs 110 for packaging and testing. The wafer 100 may comprise, for example, a 4H silicon carbide substrate having one or more silicon carbide layers formed thereon (e.g., by epitaxial growth) in some embodiments. Other semiconductor layers (e.g., polysilicon layers), insulating layers and/or metal layers may be formed on the silicon carbide semiconductor layer structure to form the power MOSFETs 110. In some cases, the silicon carbide substrate may be thinned or even removed after other semiconductor layers are formed thereon.

Figure 5A:
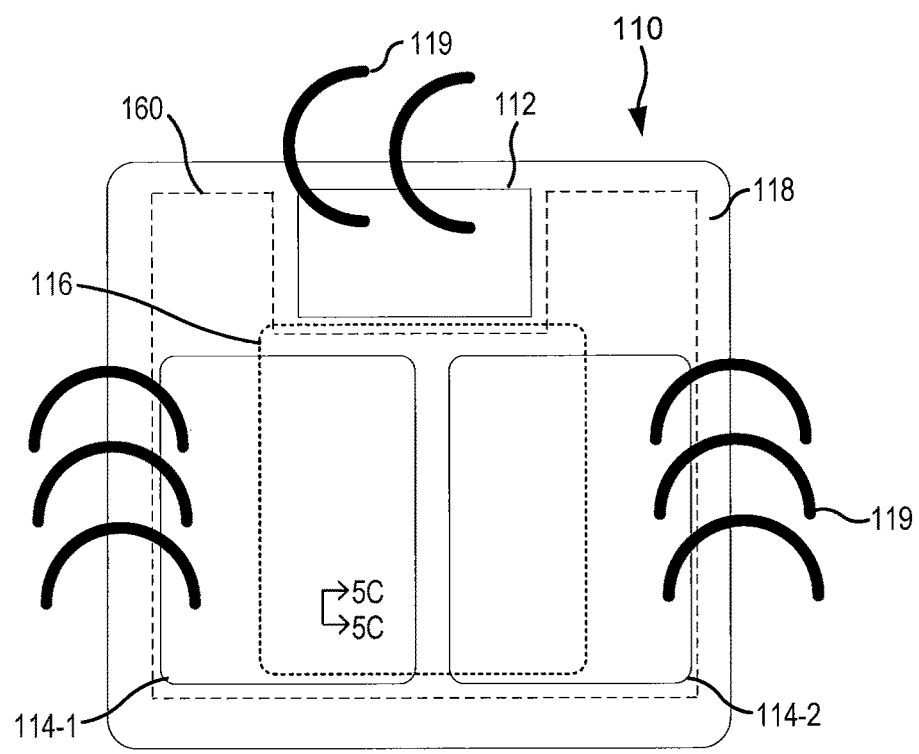
FIG. 5A is a schematic plan view of one of the power MOSFETs included on the semiconductor wafer of FIG. 4.
Figure 5B:
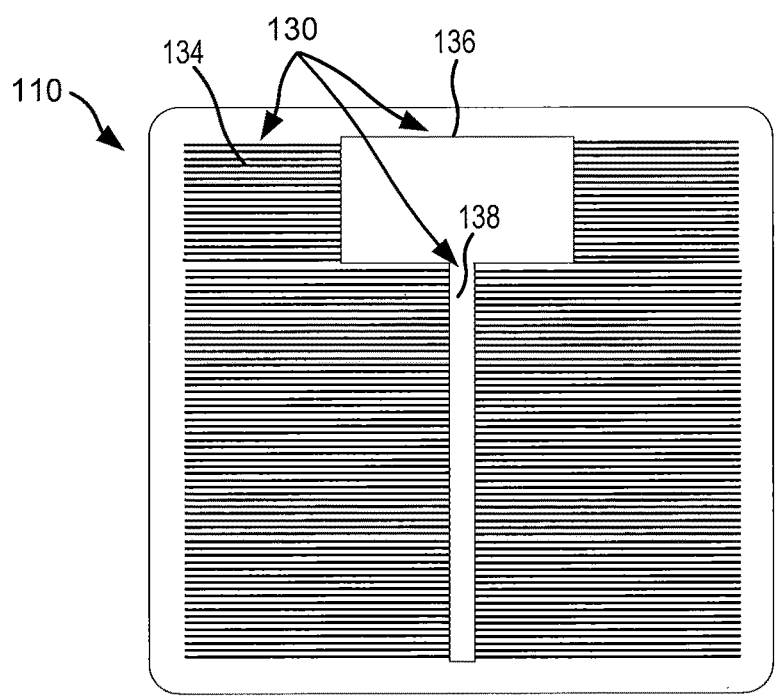
FIG. 5B is a schematic plan view of the power MOSFET of FIG. 5A with the top-side source metallization structure, the gate bond pad and the inter-metal dielectric pattern thereof omitted.

FIG. 5A is a schematic plan view of one of the power MOSFETs 110 included on the semiconductor wafer 100 of FIG. 4. FIG. 5B is a schematic plan view of the power MOSFET 110 of FIG. 5A with the top-side source metallization structure, the gate bond pad, and the inter-metal dielectric pattern thereof omitted.

As shown in FIG. 5A, a gate bond pad 112 and one or more source bond pads 114-1, 114-2 may be formed on an upper surface of a semiconductor layer structure 120 (FIG. 5C) of the MOSFET 110. A drain bond pad 116 (shown as a dotted box in FIG. 5A) may be provided on the bottom side of the MOSFET 110. Each bond pad 112, 114, 116 may be formed of a metal, such as aluminum, that bond wires can be readily attached to via conventional techniques such as thermo-compression or soldering.

As will be discussed in more detail below, the MOSFET 110 includes a top-side source metallization structure 160 that electrically connects source regions 128 in the semiconductor layer structure 120 of the MOSFET 110 to an external device. The top-side source metallization structure 160 is indicated by a dashed box in FIG. 5A as significant portions of the top-side metallization structure 160 are covered by a protective layer 118 such as a polyimide layer. The source bond pads 114-1, 114-2 may be portions of the top-side metallization structure 160 that are exposed through openings in the protective layer 118 in some embodiments. Bond wires 119 are shown in FIG. 5A that may be used to connect the gate bond pad 112 and the source bond pads 114-1, 114-2 to external circuits or the like.

Figure 5C:
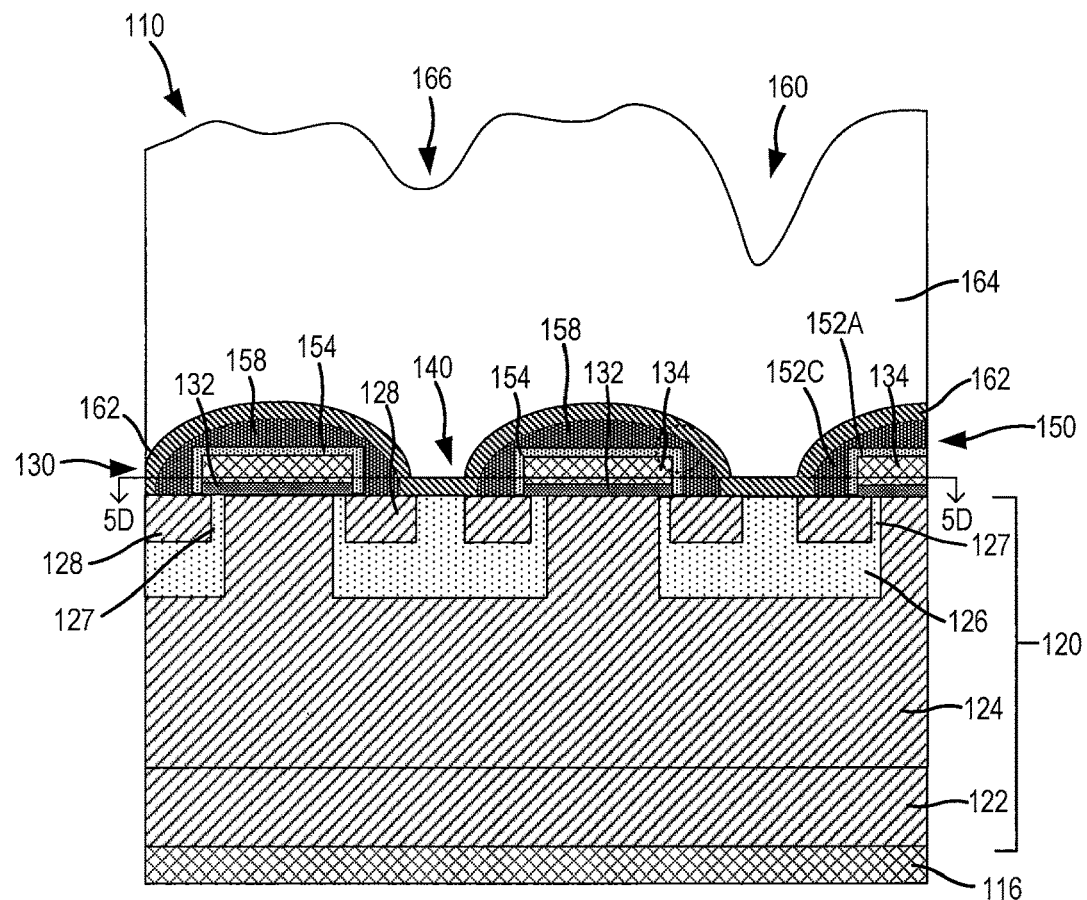
FIG. 5C is a schematic cross-sectional diagram taken along line 5C-5C of FIG. 5A.
Figure 5D:
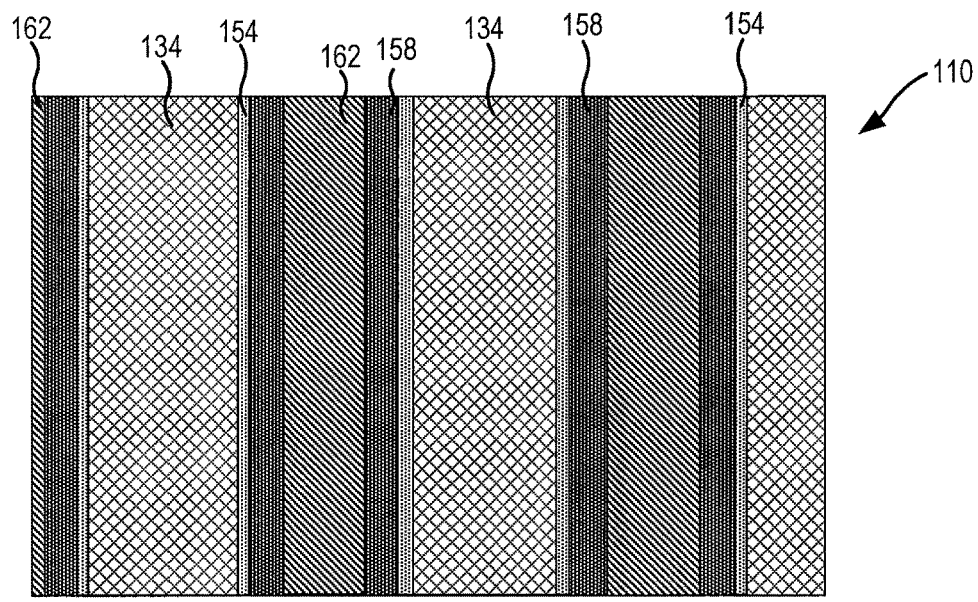
FIG. 5D is a schematic cross-sectional diagram taken along line 5D-5D of FIG. 5C.
Figure 5E:
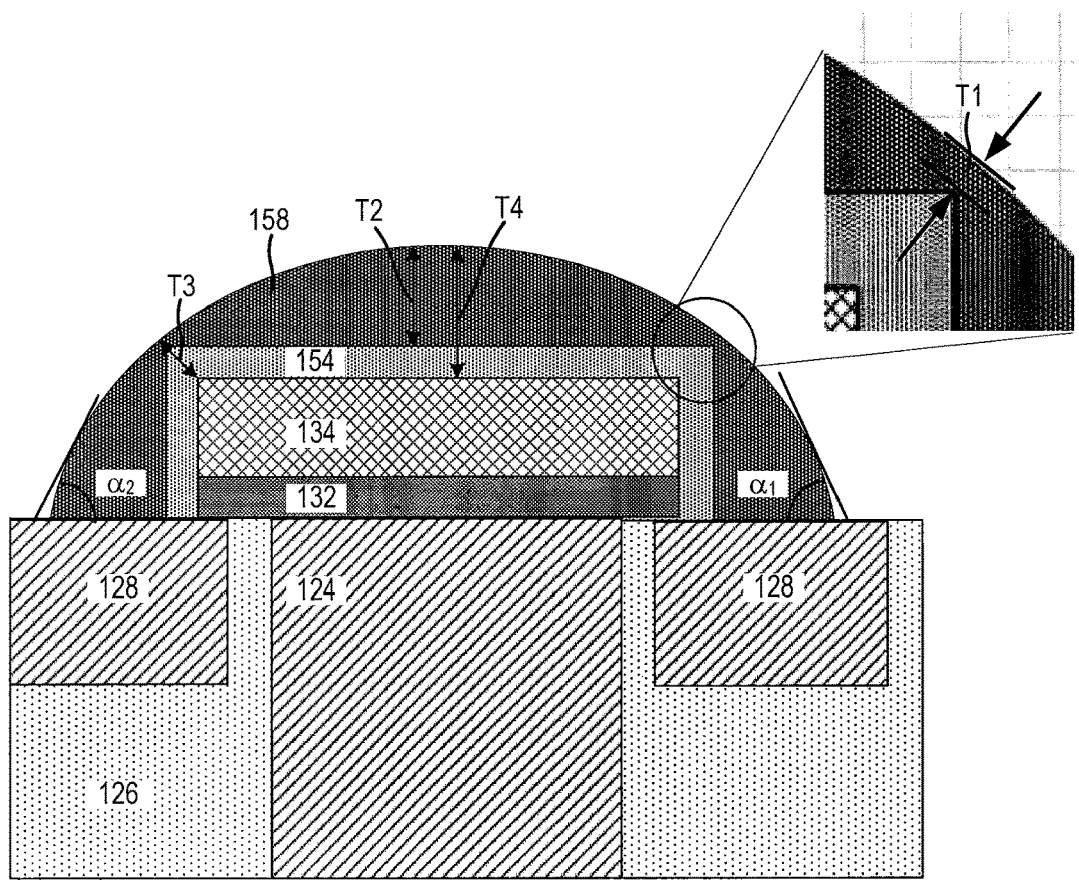
FIG. 5E is an enlarged view of one of the unit cells shown in FIG. 5C with the source metallization structure omitted.

FIG. 5C is a schematic cross-sectional diagram taken along the line 5C-5C of FIG. 5B. FIG. 5D is a schematic cross-sectional view taken along the line 5D-5D of FIG. 5C. It will be appreciated that FIGS. 5C-5D illustrate one full unit cell and portions of two additional unit cells on either side thereof in order to provide context. FIG. 5E is an enlarged view of one of the unit cells shown in FIG. 5C with the source metallization structure omitted.

Referring to FIGS. 5B-5D, a gate electrode structure 130 may be provided that includes a plurality of gate insulating fingers 132 (FIG. 5C), a plurality of gate fingers 134 (FIGS. 5B-5D), a gate pad 136 (FIG. 5B), and one or more gate buses 138 (FIG. 5B) that electrically connect the gate fingers 134 to the gate pad 136. The electrical connections between the gate fingers 134, the gate buses 138 and the gate pad 136 may be conventional and hence will not be described herein or shown in the figures. The gate insulating fingers 132 may comprise, for example, silicon oxide, and may insulate the gate fingers 134 from an underlying semiconductor layer structure 120. The gate fingers 134 may comprise, for example, a polysilicon pattern in some embodiments, although metal or other conductive patterns could also be used. The gate fingers 134 may extend horizontally across the device, or may alternatively comprise a planar layer that extends across the upper surface of the semiconductor layer structure 120 that has openings therein through which the top-side source metallization structure 160 (discussed below) connects to the source regions 128 in the semiconductor layer structure 120. The gate pad 136 may be directly underneath and electrically connected to the gate bond pad 112 in some embodiments. In other embodiments, the gate pad 136 may also serve as the gate bond pad 112. Other configurations are possible. The gate pad 136 and the gate bus 138 may comprise polysilicon and/or metal in example embodiments.

As shown in FIGS. 5C-5D, an inter-metal dielectric pattern 150 may comprise a plurality of individual dielectric fingers 152 that cover the respective gate fingers 134 and gate bus(es) 138. The inter-metal dielectric pattern 150 may insulate the gate electrode structure 130 from the source metallization structure 160. As noted above, the gate fingers 134 of the electrode structure 130 may be polysilicon gate fingers. It will therefore be appreciated that in some embodiments the "inter-metal" dielectric pattern 150 may be a pattern that is formed to insulate a semiconductor pattern from a metal pattern as opposed to insulating two metal patterns from each other.

The top-side source metallization structure 160 may be formed on the inter-metal dielectric pattern 150. The top-side source metallization structure 160 includes a diffusion barrier layer 162 and a source contact layer 164. The MOSFET 110 includes a plurality of unit cell transistors that are electrically connected in parallel. The individual layers/patterns of MOSFET 110 will now be discussed in greater detail.

Referring to FIGS. 5C-5E, the unit cell transistor may be formed on an n-type silicon carbide semiconductor substrate 122 such as, for example, a single crystal 4H silicon carbide semiconductor substrate that is heavily-doped (e.g., between $1\times10^{18}$ atoms/cm$^3$ and $1\times10^{21}$ atoms/cm$^3$) with n-type impurities. Herein, the "doping concentration" of a semiconductor material refers to the number of dopant atoms that cause the semiconductor material to have a certain conductivity type (i.e., either n-type or p-type) that are present within a cubic centimeter of semiconductor material as measured using standard measurement techniques such as Secondary Ion Mass Spectrometry ("SIMS"). The substrate 122 may have any appropriate thickness (e.g., between 100 and 500 microns thick), and may be partially or fully removed in some embodiments. It will be appreciated that the thickness of the substrate 122 is not drawn to scale in FIG. 5C.

A drain contact may be formed on the lower surface of the semiconductor substrate 122. The drain contact may serve as both an ohmic contact to the semiconductor substrate 122 and as a drain bond pad 116 that provides an electrical connection between the drain terminal of the MOSFET 110 and external devices. In other embodiments, the drain contact may be separate from the drain bond pad 116 (e.g., a second layer may be formed on the drain contact that acts as the drain bond pad 116). In the depicted embodiment, a single metal layer 116 is formed on the lower surface of the semiconductor substrate 122 that acts as both an ohmic drain contact and as a drain bond pad. The drain contact/drain bond pad 116 may comprise, for example, metals such as nickel, titanium, tungsten and/or aluminum, and/or alloys and/or thin layered stacks of these and/or similar materials.

A lightly-doped n-type (n⁻) silicon carbide drift region 124 is provided on an upper surface of the substrate 122. The n-type silicon carbide drift region 124 may, for example, be formed by epitaxial growth on the silicon carbide substrate 122. The n-type silicon carbide drift region 124 may have, for example, a doping concentration of $1\times10^{14}$ to $5\times10^{16}$ dopants/cm$^3$. The n-type silicon carbide drift region 124 may be a thick region, having a vertical height above the substrate 122 of, for example, 3-100 microns. It will be appreciated that the thickness of the drift region 124 is not drawn to scale in FIG. 5C. While not shown in FIG. 5C, in some embodiments an upper portion of the n-type silicon carbide drift region 124 may be more heavily doped (e.g., a doping concentration of $1\times10^{16}$ to $1\times10^{17}$ dopants/cm$^3$) than the lower portion thereof to provide a current spreading layer in the upper portion of the n-type silicon carbide drift region 124.

P-type well regions 126 are formed in upper portions of the n-type drift region 124. Heavily-doped (n⁺) n-type silicon carbide source regions 128 may then be formed in upper portions of the well regions 126 by, for example, ion implantation. Channel regions 127 are defined in the sides of the well regions 126. The substrate 122, the drift region 124, the well regions 126 and the source regions 128 may together comprise the semiconductor layer structure 120 of the MOSFET 110.

After the n-type source regions 128 are formed, a plurality of gate insulating fingers 132 (which collectively comprise a gate insulating pattern) may be formed on the upper surface of the semiconductor layer structure 120. Each gate insulating finger 132 may comprise, for example, an elongated strip of dielectric material such as silicon oxide, silicon nitride, silicon oxynitride or the like. Gate fingers 134 such as polysilicon gate fingers 134 are formed on each gate insulating finger 132. The gate fingers 134 and the gate insulating fingers 132 collectively comprise a gate electrode structure 130. As noted above, vertically-extending portions of the well regions 126 that are between the source regions 128 and the portions of the drift region 124 that are directly under each gate finger 134 comprise channel regions 127. The channel regions 127 electrically connect the n-type source regions 128 to the drift region 124 when a sufficient bias voltage is applied to the gate fingers 134. When the bias voltage is applied to the gate fingers 134, current may flow from the n-type source regions 128 through the channel regions 127 to the drift region 124 and down to the drain contact 116.

An inter-metal dielectric pattern 150 is formed that may comprise a plurality dielectric fingers 152 in the form of spaced-apart stripes of dielectric material. The inter-metal dielectric pattern 150 may comprise a multi-layer dielectric pattern that includes a first non-reflowable dielectric pattern 154 and a second reflowed dielectric pattern 158. As will be discussed in more detail below, the second reflowed dielectric pattern 158 is formed by forming a second reflowable dielectric pattern 156 and then heating the device to reflow the material of the second reflowable dielectric pattern 156. The second reflowable dielectric pattern 156 is not shown in FIG. 5C, but is depicted in FIG. 6D (FIGS. 6A-6E illustrate a process for forming the inter-metal dielectric pattern 150 of FIG. 5C).

The first non-reflowable dielectric pattern 154 may, in some embodiments, be formed on the exposed top surfaces of the gate fingers 134 and on the exposed side surfaces of the gate insulating fingers 132 and the gate fingers 134. Thus, the first non-reflowable dielectric pattern 154 may comprise a plurality of non-reflowable dielectric fingers 152A that cover the top surface and side surfaces of the respective gate fingers 134 and the side surfaces of the underlying gate insulating fingers 132. The first non-reflowable dielectric pattern 154 may, for example, be a silicon oxide pattern, a silicon nitride pattern, or a combination of silicon oxide and silicon nitride patterns that are not reflowable patterns. For example, a silicon oxide pattern that is undoped, doped only with phosphorous or that is doped with phosphorous and at most a small amount of boron may be a non-reflowable pattern. It will be appreciated, however, that a wide variety of other non-reflowable dielectric materials may be used to form the first non-reflowable dielectric pattern 154 such as, for example, aluminum oxide, magnesium oxide or mixtures of these or other oxides and nitrides with silicon dioxide to form silicate or oxy-nitride alloyed dielectrics. Suitable materials may exhibit a relatively high bandgap (e.g., greater than 5 eV) and a relatively high breakdown voltage. In some embodiments, the first non-reflowable dielectric pattern 154 may include multiple layers of non-reflowable dielectric materials.

As discussed above, the inter-metal dielectric patterns according to embodiments of the present invention may include both a non-reflowable dielectric layer/pattern and a reflowable dielectric layer/pattern. Reflowable dielectric layers and patterns have a low viscosity as the temperature thereof approaches or exceeds the glass transition temperature.

The first non-reflowable dielectric pattern 154 may be formed conformally on the gate fingers 134 and underlying gate insulating fingers 132. Consequently, the first non-reflowable dielectric material 154 may have a relatively uniform thickness. In some embodiments, the thickness of the first non-reflowable dielectric pattern 154 may be sufficient to prevent breakdown of the inter-metal dielectric pattern 150 during device operation. In such embodiments, even if the second reflowed dielectric pattern 158 has regions that are extremely thin, the first non-reflowable dielectric pattern 154 may separate the gate fingers 134 from the source metallization structure 160 and may have a thickness that is sufficient to prevent breakdown during normal operation of the MOSFET 110. For example, a minimum thickness of the reflowed dielectric material pattern 158 may be at least 0.1 microns in some embodiments, or at least 0.2 microns in other embodiments. In other embodiments, the thickness of the first non-reflowable dielectric pattern 154 may be less than a thickness that is sufficient to prevent breakdown of the inter-metal dielectric pattern 150, but the minimum combined thickness of the first non-reflowable dielectric pattern 154 and the second reflowed dielectric pattern 158 may be sufficient to prevent breakdown. In still other embodiments, a thickness of the first non-reflowable dielectric pattern 154 may be greater than or equal to a thickness of the gate insulating fingers 132.

The second reflowable dielectric pattern 156 may, in some embodiments, be formed directly on top of the first non-reflowable dielectric pattern 154. As discussed above, the first non-reflowable dielectric pattern 154 may comprise a plurality of non-reflowable dielectric fingers 152A that cover the top surface and side surfaces of the respective gate fingers 134 and the side surfaces of the underlying gate insulating fingers 132. The second reflowable dielectric pattern 156 may comprise a plurality of reflowable dielectric fingers 152B (see FIG. 6D) that cover the top and side surfaces of the respective non-reflowable dielectric fingers 152A. The second reflowable dielectric pattern 156 may, for example, BPSG, which is a boron and phosphorous doped silicon oxide material that is reflowable at temperatures of, for example, between 500-1000° C. Other alloying elements other than boron and phosphorous may be used in the flowable glass, and/or other flowable dielectric materials may be used. The second reflowable dielectric pattern 156 may be heated to reflow the dielectric material therein to form the second reflowed dielectric pattern 158. The second reflowed dielectric pattern 158 may comprise a plurality of dielectric fingers 152C. The ratio of the thickness of the non-reflowable dielectric pattern 154 to the thickness of the second reflowable dielectric pattern 156 may be 2:1, 1:2, 1:4, 1:7 and 1:10 in example embodiments. In other words, the ratio of the thickness of the non-reflowable dielectric pattern 154 to the thickness of the second reflowable dielectric pattern 156 may be between 2:1 and 1:10. In most applications, the thickness of the non-reflowable dielectric pattern 154 will be less than the thickness of the second reflowable dielectric pattern 156.

As will be discussed in greater detail with reference to FIGS. 6A-6E, the second reflowable dielectric pattern 156 may be formed conformally on the first non-reflowable dielectric pattern 154 and may then be reflowed by heating the second reflowable dielectric pattern 156 to a temperature of, for example, 800-1000° C. to convert the second reflowable dielectric pattern 156 into the second reflowed dielectric pattern 158. When the second reflowable dielectric pattern 156 is reflowed, surface tension in the reflowed dielectric material that comprises the second reflowed dielectric pattern 158 may cause the second reflowed dielectric pattern 158 to have a generally semi-oval or semi-circular cross-section, as shown in FIG. 5C. The thickness of the portions of the second reflowed dielectric pattern 158 that are closest to the top side edges of the gate fingers 134 (one such portion is enclosed within a dotted circle in FIG. 5C) may have thicknesses that are substantially smaller than the thicknesses of other portions of the second reflowed dielectric pattern 158. For example, as shown in FIG. 5E, which is an enlarged view of a small portion of FIG. 5C (with the source metallization structure 160 omitted), a thickness T1 of the second reflowed dielectric pattern 158 that is adjacent the upper side edge of the gate finger 134 may be significantly less than a thickness T2 of a top portion of the second reflowed dielectric pattern 158. In some embodiments, the thickness 12 may be at least twice, three times, four times, five times or six times the thickness T1. The provision of the first non-reflowable dielectric pattern 154 underneath the second reflowed dielectric pattern 158 may ensure that the total thickness of the inter-metal dielectric pattern 150 adjacent the top side edges of the gate fingers 134 may be sufficient to prevent breakdown. For example, as shown in FIG. 5E, the distance T3, which represents the thickness of the inter-metal dielectric pattern 150 at the top side edge of the gate finger 134, may be designed to be sufficient to avoid breakdown.

A maximum thickness of the inter-metal dielectric pattern 150 may be above the top surface of the center of a gate finger 134 (i.e., T4) in some embodiments. A maximum thickness of the inter-metal dielectric pattern 150 may be adjacent the top side edges of the gate fingers 134 (i.e., adjacent the top corner of the gate fingers 134). A ratio of the thickness of the inter-metal dielectric pattern 150 above the top surface of the center of a gate finger 134 (i.e., T4) to the minimum thickness of the inter-metal dielectric pattern 150 (which typically is T3 in FIG. 5E) may be less than 8-to-1, less than 6-to-1, less than 5-to-1, less than 4-to-1, less than 3-to-1, or even less than 2-to-1 in various embodiments of the present invention, and may be at least 1-to-1 in each of these embodiments.

In some embodiments, the combination of the non-reflowable dielectric pattern 154 and the second reflowed dielectric pattern 158 may have a thickness that is about the same as the thickness of the reflowed BPSG inter-metal dielectric pattern 50A in the embodiment of FIG. 3. Consequently, the second reflowed dielectric pattern 158 may have a reduced thickness as compared to the reflowed BPSG inter-metal dielectric pattern 50A of FIG. 3, and hence during reflow the second reflowable dielectric pattern 156 will not spread as far laterally, thereby maintaining a desired width for the gaps 140. Thus, the inter-metal dielectric patterns 150 according to embodiments of the present invention may have the advantages of a fully reflowable inter-metal dielectric pattern while reducing or minimizing the potential disadvantages associated with a fully reflowable inter-metal dielectric pattern.

Referring again to FIG. 5C, the n-type source regions 128 are exposed in the gaps 140 between adjacent reflowed dielectric fingers 152C. As discussed above, in silicon carbide power devices, the width of each gap 140 may be very narrow such as on the order of 1-5 microns. Moreover, as technologies continue to develop, the gaps 140 are becoming smaller, and gaps 140 as small as 0.5 microns may be realized in commercial devices in the near future. Such small gaps 140 may be difficult to fill with a top-side source metallization structure 160 (discussed below) without forming voids in the top-side source metallization structure 160.

The second reflowed dielectric pattern 158 may have rounded edges and, consequently, the angles $\alpha_1$ and $\alpha_2$ (see FIG. 5E) may be smaller, resulting in gaps 140 that are easier to completely fill with the diffusion barrier layer metal. Thus, the MOSFETs 110 may be less susceptible to formation of voids in portions of the diffusion barrier layer 162 that are within the gaps 140.

A top-side source metallization structure 160 is formed on the inter-metal dielectric pattern 150 and on the well regions 126 and n-type source regions 128 in the semiconductor layer structure 120 that are exposed in the gaps 140. The top-side source metallization structure 160 includes the diffusion barrier layer 162 and a source contact layer 164 that is formed on the diffusion barrier layer 162. The diffusion barrier layer 162 may be a metal or metal-containing layer that is relatively inert with respect to adjacent layers and that retards or substantially prevents diffusion of other materials therethrough. The diffusion barrier layer 162 may comprise, for example, a continuous conductive layer that includes titanium, tungsten, tantalum, nickel, hafnium and/or indium. For example, the diffusion barrier layer 162 may comprise titanium, tantalum, nickel, hafnium, tungsten, titanium nitride, tungsten nitride, indium oxide, or tantalum nitride or alloys of the aforementioned materials. The diffusion barrier layer 162 may be formed conformally on the exposed portion of the semiconductor layer structure 120 (e.g., on the well regions 126 and source regions 128) and on the inter-metal dielectric pattern 150. The diffusion barrier layer 162 is typically formed of a metal that is less conductive than the metal included in the source contact layer 164. As such, the diffusion barrier layer 162 may be a relatively thin layer in order to reduce the impact thereof on the resistance of the top-side source metallization structure 160.

The source contact layer 164 may be conformally formed on the diffusion barrier layer 162. The source contact layer 164 may comprise, for example, metals such as nickel, titanium, tungsten and/or aluminum, and/or alloys and/or thin layered stacks of these and/or similar materials. The source contact layer 164 may comprise an aluminum layer in some embodiments, as aluminum is relatively inexpensive, highly conductive, easy to deposit, and may act as a good seed layer for other metals. The source contact layer 164 may be substantially thicker than the diffusion barrier layer 162. The thickness of the source contact layer 164 may reflect a trade-off between the resistance of the top-side source metallization structure 160 (which is desired to be low) and the depth of the keyholes 166 which tend to form in the portions of the source contact layer 164 that are above the source regions 128. Generally speaking, as a thickness of the source contact layer 164 is increased, the resistance of the source contact layer 164 is increased, while the average depth of the keyholes 166 is reduced. As shown in FIG. 5C, the gate electrode structure 130 is between the wide bandgap semiconductor layer structure 120 and the inter-metal dielectric pattern 150, and the inter-metal dielectric pattern 150 is between the gate electrode structure 130 and the source metallization structure 160.

FIGS. 6A-6E are schematic cross-sectional diagrams that illustrate formation of the inter-metal dielectric pattern 150 of the MOSFET of FIGS. 5A-5E. FIGS. 6A-6E correspond to the enlarged view of FIG. 5E, which shows a single unit cell, in order to simplify the drawings.

Figure 6A:
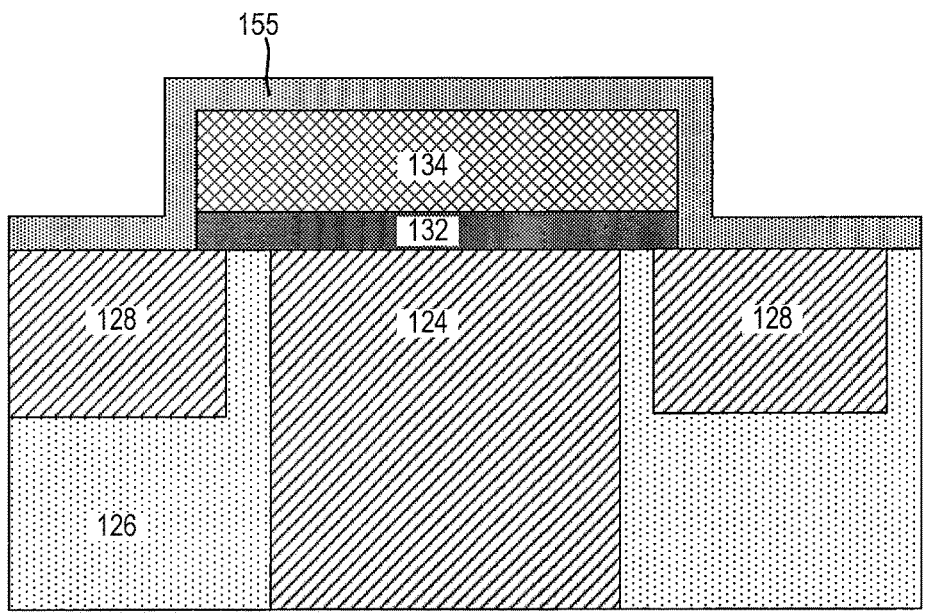
FIGS. 6A-6E are schematic cross-sectional diagrams that illustrate a method of forming the inter-metal dielectric pattern of the MOSFET of FIGS. 5A-5E.
Figure 6B:
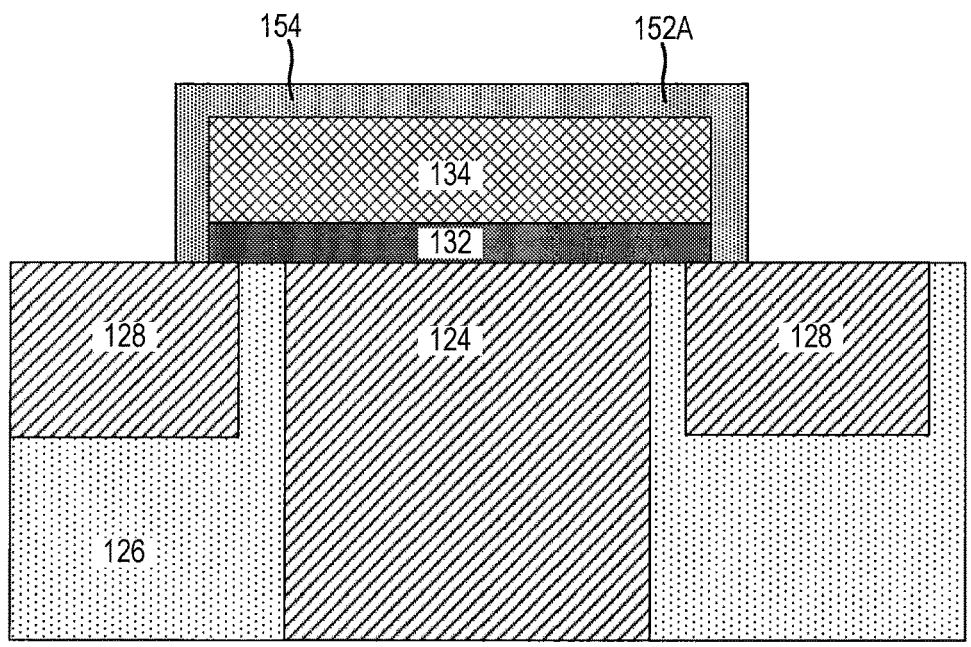
Figure 6C:
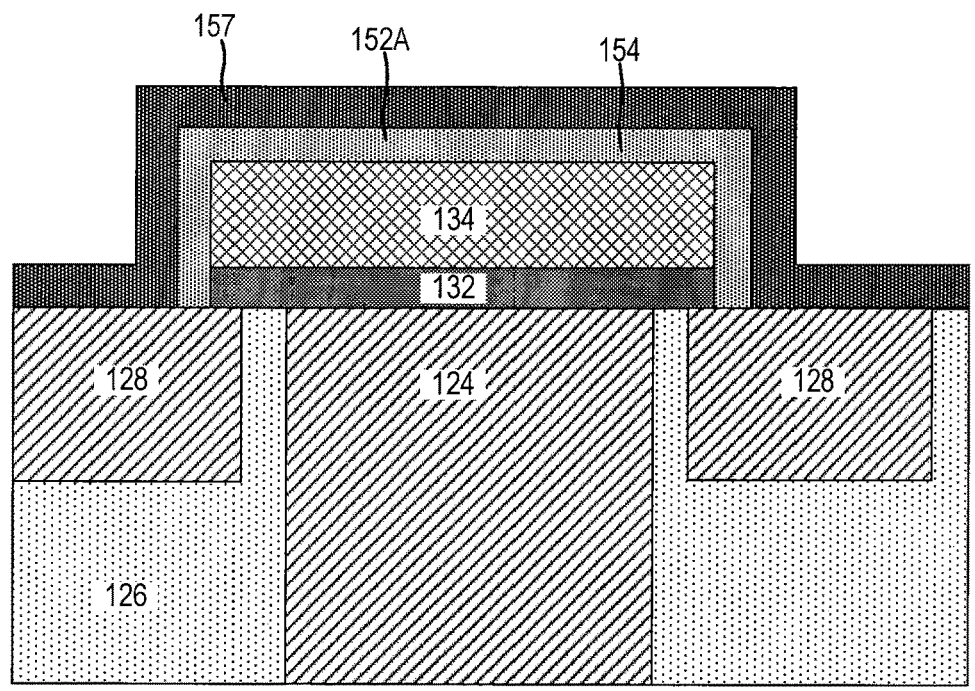
Figure 6D:
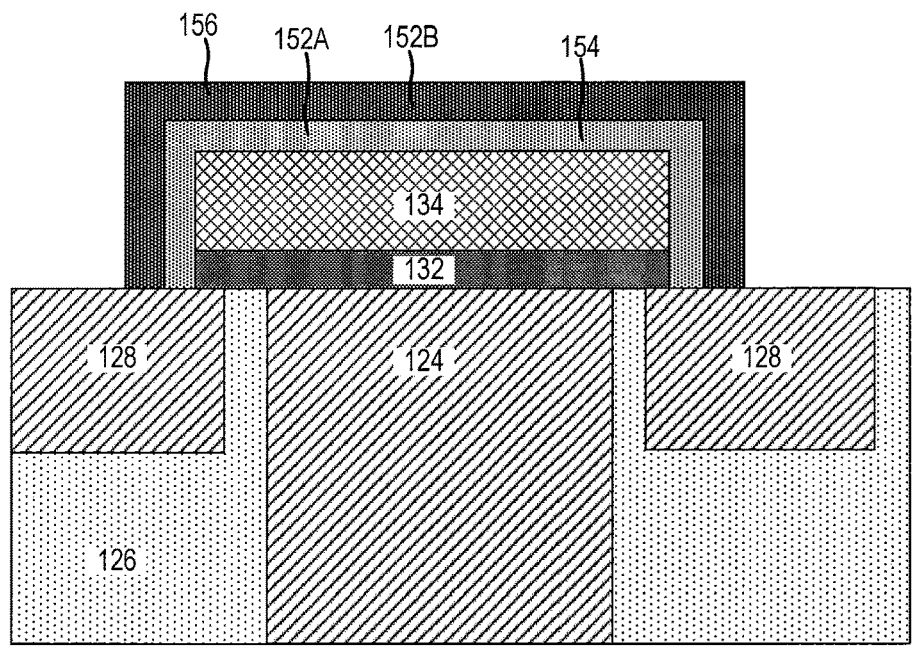
Figure 6E:
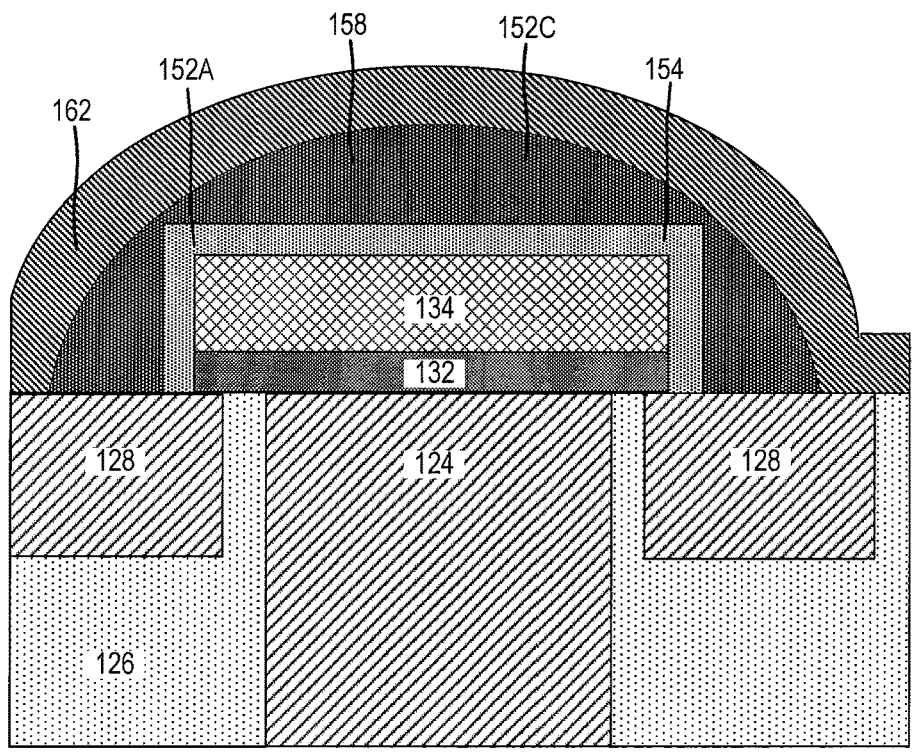

As shown in FIG. 6A, a non-reflowable dielectric layer 155 is conformally formed on the top surface of the device to cover the gate fingers 134 and sidewalls of the gate insulating fingers 132. As shown in FIG. 6B, the non-reflowable dielectric layer 155 is then selectively etched to form the first non-reflowable dielectric pattern 154, which comprises a plurality of dielectric fingers 152A (only one of which is visible in FIG. 6B) that cover the respective gate fingers 134 and sidewalls of the respective gate insulating fingers 132. As shown in FIG. 6C, a reflowable dielectric layer 157 is conformally formed on the first non-reflowable dielectric pattern 154. As shown in FIG. 6D, the reflowable dielectric layer 157 is then selectively etched to form the second reflowable dielectric pattern 156, which comprises a plurality of dielectric fingers 152B (only one of which is visible in FIG. 6D) that cover the respective dielectric fingers 152A. Finally, as shown in FIG. 6E, the device is heated to a temperature of, for example, between 500-1000° C. to reflow the material of the second reflowable dielectric pattern 156 to convert the second reflowable dielectric pattern 156 into a second reflowed dielectric pattern 158 and to convert the individual reflowable dielectric fingers 152B into reflowed dielectric fingers 152C. Finally, the diffusion barrier layer 162 may be conformally formed on the second reflowed dielectric pattern 158 and on the exposed portions of the well regions 126 and source regions 128. As described above, the inclusion of the first non-reflowable dielectric pattern 154 in the inter-metal dielectric pattern 150 may ensure that the minimum thickness of the inter-metal dielectric pattern 150 is sufficient to prevent breakdown during device operation.

In the fabrication process for the inter-metal dielectric pattern 150 that is discussed above with reference to FIGS. 6A-6E, the second reflowable dielectric pattern 156 is first etched to expose the source regions 128 and then reflowed to form the second reflowed dielectric pattern 158. It will be appreciated, however, that in other embodiments the second reflowable dielectric layer 157 may be reflowed to form a reflowed dielectric layer and that then the reflowed dielectric layer may be etched to form the second reflowed dielectric pattern 158 that exposes the source regions 128. Reflowing the second reflowable dielectric layer 157 (i.e., performing reflow prior to etching) may be advantageous in certain applications as it may allow for removal of portions of the reflowed dielectric layer that expand laterally during the reflow process, thereby maintaining a desired size of the openings in the inter-metal dielectric pattern 150 that expose the source regions 128.

Figure 7A:
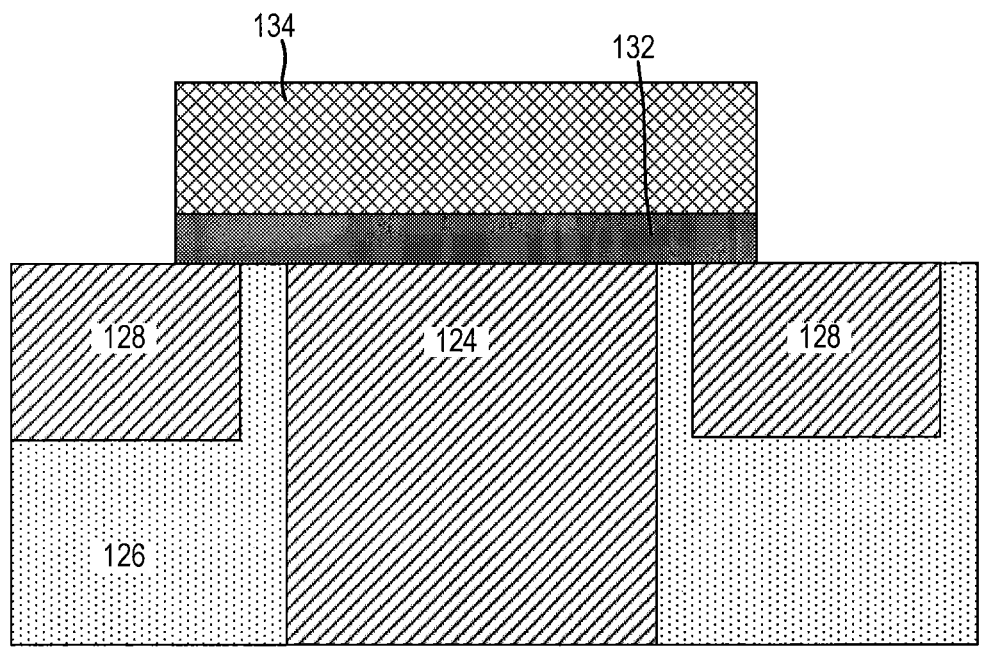
FIGS. 7A-7B are cross-sectional diagrams illustrating another method of forming the inter-metal dielectric pattern of the MOSFET of FIGS. 5A-5E.
Figure 7B:
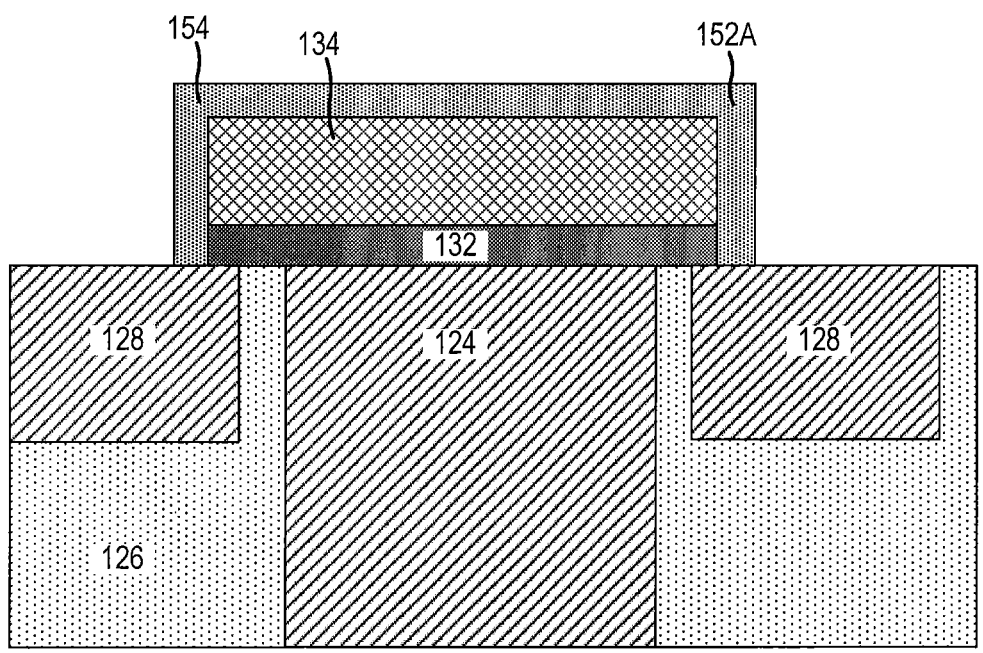

FIGS. 7A and 7B are schematic cross-sectional diagrams illustrating another method of forming the inter-metal dielectric pattern 150 of the MOSFET 110 of FIGS. 5A-5E. As shown in FIG. 7A, a gate electrode structure that includes a plurality of gate insulating fingers 132 and a plurality of gate fingers 134 is formed on the upper surface of the semiconductor layer structure 120. The gate insulating fingers 132 and gate fingers 134 may be wider than the corresponding gate insulating fingers 132 and gate fingers 134 included in the embodiment of FIGS. 6A-6E, and the gate fingers 134 may be thicker than the corresponding gate fingers 134 included in the embodiment of FIGS. 6A-6E. Next, as shown in FIG. 7B, a non-reflowable dielectric pattern 154 is formed by oxidizing the exposed top and side surfaces of the gate fingers 134. The gate fingers 134 may comprise, for example, polysilicon gate fingers 134 that are not doped with boron, and hence oxidation thereof converts an upper portion and side portions of each gate finger 134 into a respective non-reflowable dielectric finger 152A. The oxidation process may be designed to oxidize a predetermined thickness of the outer portion of each gate finger 134 in order to form the first non-reflowable dielectric pattern 154 that has a desired thickness on each gate finger 134. The oxidation process may be carried out at a temperature that is high enough to oxidize polysilicon but that is not high enough to oxidize silicon carbide, so that the exposed silicon carbide source regions 128 are not appreciably oxidized during the oxidation process. After the first non-reflowable dielectric pattern 154 is formed by the oxidation process, the second reflowable dielectric pattern 156 may be formed and then reflowed in the manner discussed above with reference to FIGS. 6C-6E. Notably, by using an oxidation process to form the first non-reflowable dielectric pattern 154, the etching step discussed above with reference to FIG. 6B may be omitted, thereby simplifying the fabrication process.

Figure 8A:
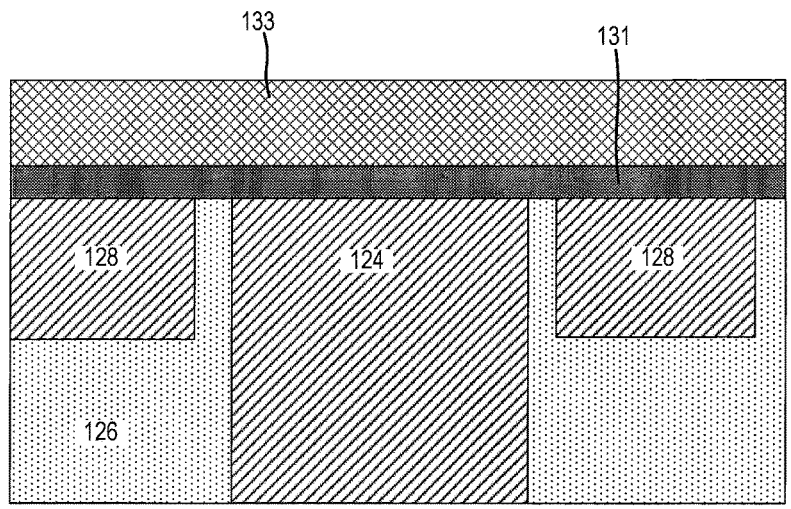
FIGS. 8A-8F are cross-sectional diagrams illustrating a method of forming an inter-metal dielectric pattern that could be used in place of the inter-metal dielectric pattern of the MOSFET of FIGS. 5A-5E.
Figure 8B:
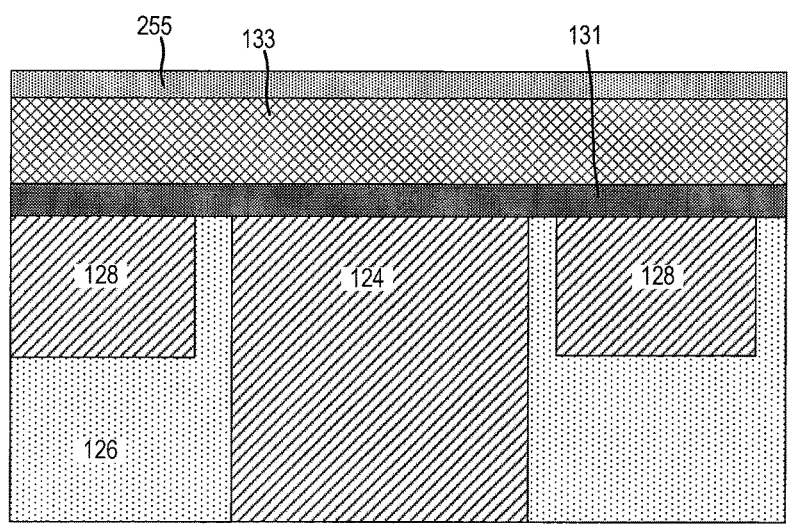
Figure 8C:
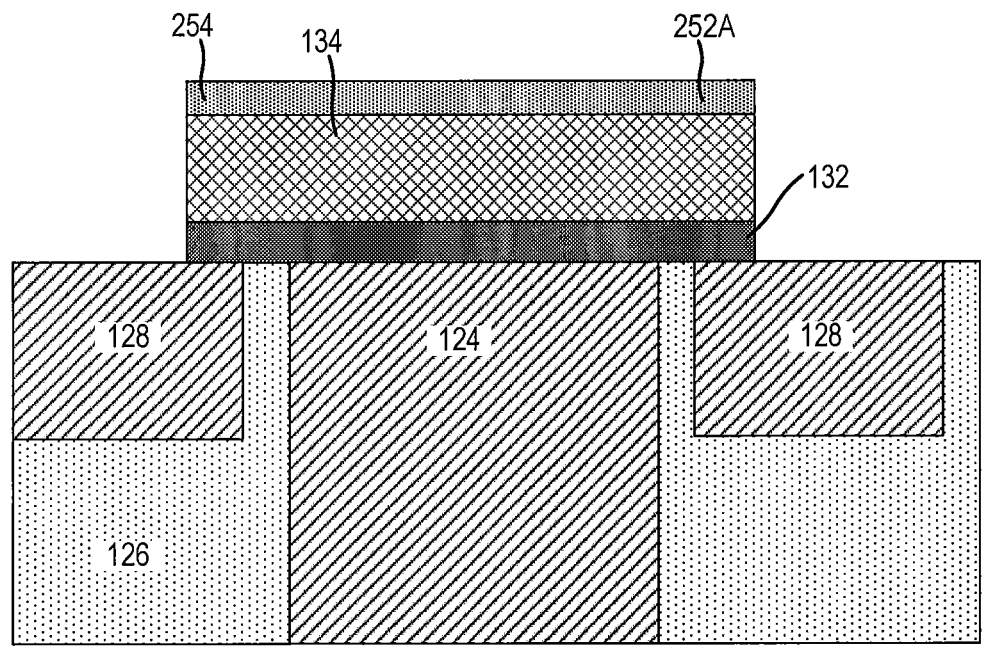

FIGS. 8A-8F are cross-sectional diagrams illustrating a method of forming an inter-metal dielectric pattern 250 that could be used in place of the inter-metal dielectric pattern 150 of the MOSFET 110 of FIGS. 5A-5E. As shown in FIG. 8A, a gate insulating layer 131 and a gate finger layer 133 may be formed on a semiconductor layer structure 120. Next, as shown in FIG. 8B, a non-reflowable dielectric layer 255 such as, for example, a silicon dioxide layer, is formed on the gate finger layer 133. The non-reflowable dielectric layer 255 may be formed, for example, by plasma enhanced chemical vapor deposition, low pressure chemical vapor deposition or oxidation of a top surface of the gate electrode structure 130. As shown in FIG. 8C, an etching step is performed to etch the gate insulating layer 131, the gate finger layer 133 and the non-reflowable dielectric layer 255 in order to expose the source regions 128, thereby converting the gate insulating layer 131, the gate finger layer 133 and the non-reflowable dielectric layer 255 into a plurality of gate insulating fingers 132, a plurality of gate fingers 134 and a first non-reflowable dielectric pattern 254 that comprises a plurality of dielectric fingers 252A. Note that in this embodiment, the dielectric fingers 252A only cover the respective top surfaces of the gate fingers 134 and do not cover the side surfaces of the gate fingers 134.

Figure 8D:
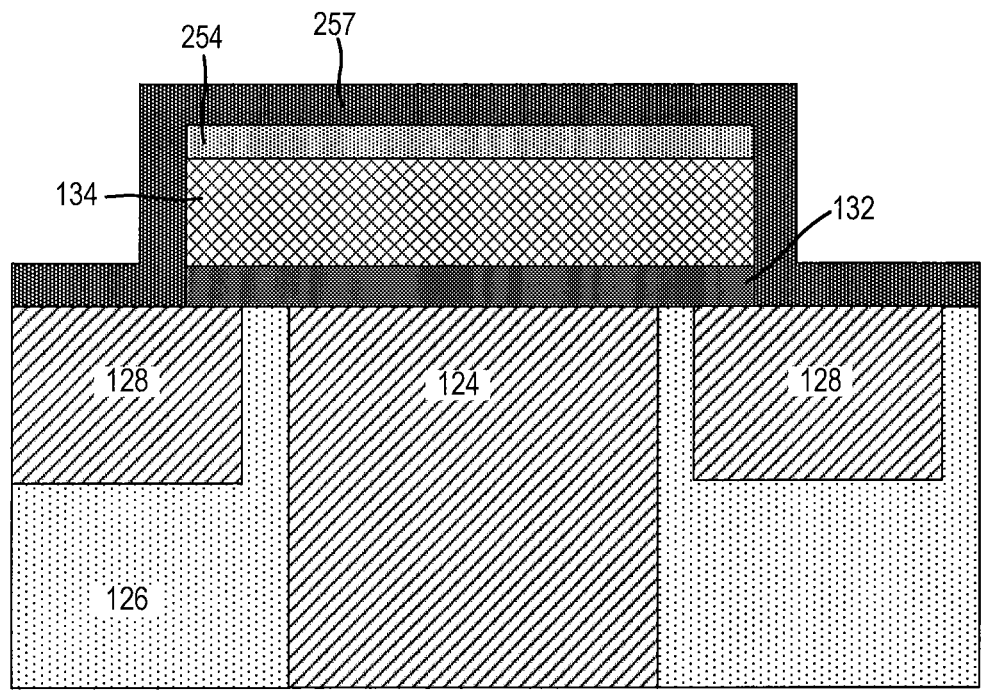
Figure 8E:
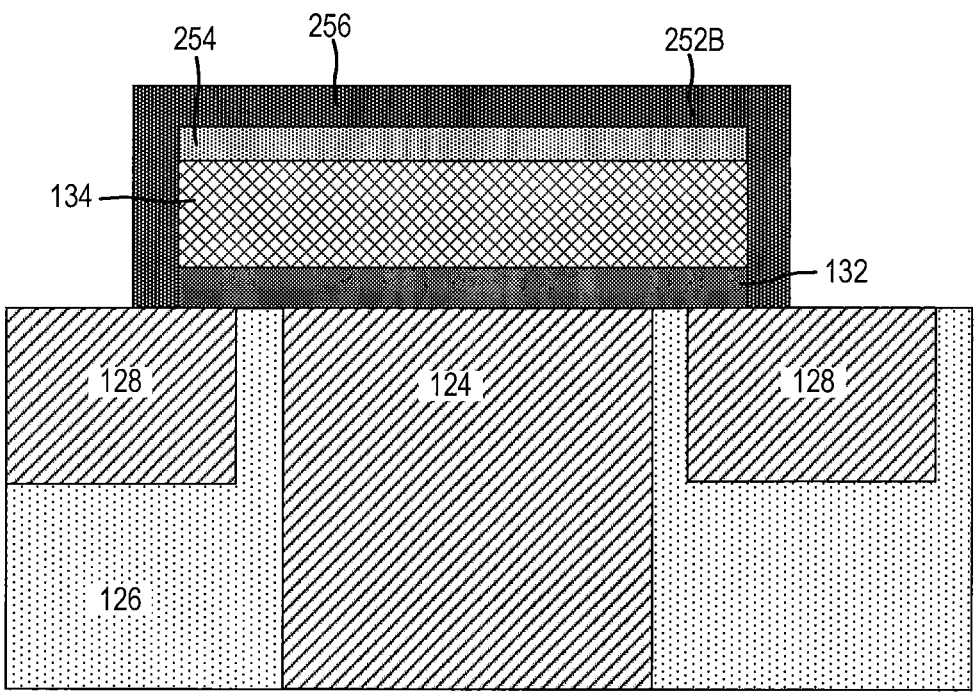
Figure 8F:
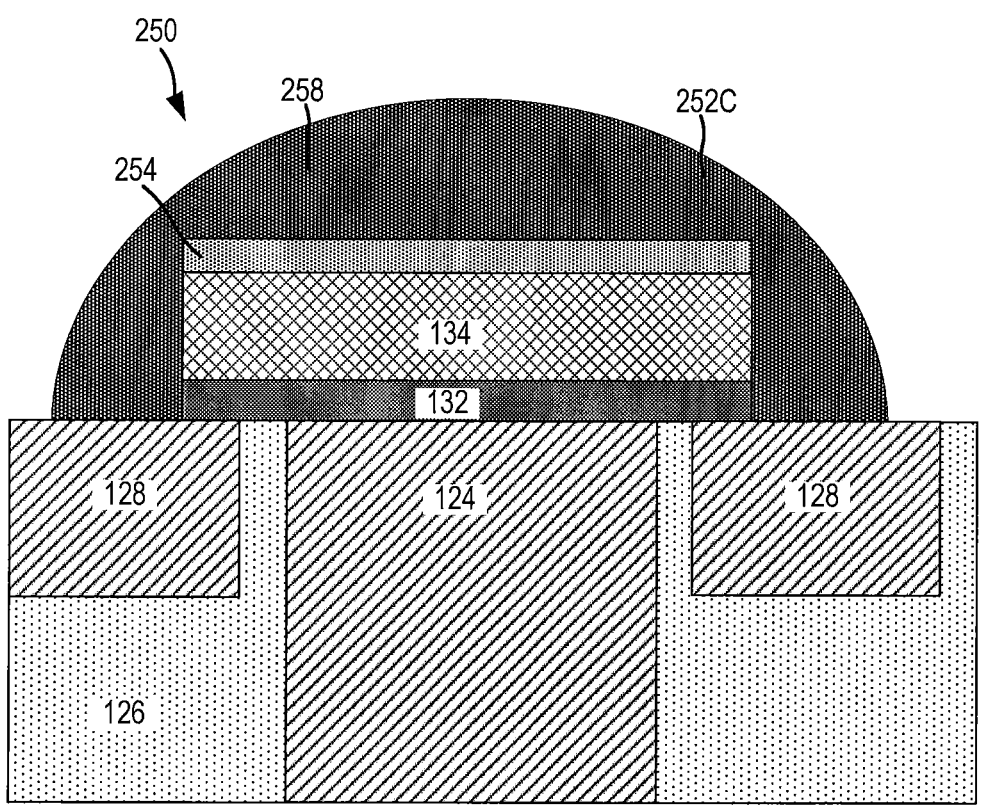

As shown in FIG. 8D, a second reflowable dielectric layer 257 is conformally formed on the device. As shown in FIG. 8E, the second reflowable dielectric layer 257 is then selectively etched to form a second reflowable dielectric pattern 256, which comprises a plurality of reflowable dielectric fingers 252B that cover the respective dielectric fingers 252A. Finally, as shown in FIG. 8F, the device is heated to a temperature of, for example, between 500-1000° C. to reflow the material of the second reflowable dielectric pattern 256 to convert the second reflowable dielectric pattern 256 into a second reflowed dielectric pattern 258 that comprises a plurality of reflowable dielectric fingers 252C. This technique for forming the inter-metal dielectric pattern 250 may likewise require one less etching step than the technique discussed above with reference to FIGS. 6A-6E. It will be appreciated that alternatively the second reflowable dielectric layer 257 can be reflowed and then etched to form the second reflowable dielectric pattern 258 in other embodiments.

Pursuant to further embodiments of the present invention, power semiconductor devices are provided that include reflowed inter-metal dielectric patterns that are shaped using sacrificial structures during the reflow process. In particular, sacrificial structures may be deposited on the device before or after formation of the reflowable dielectric pattern. These sacrificial structures are left in place during the reflow process and may be used to (1) limit the lateral flow of the reflowable dielectric material during the reflow process and/or to (2) increase the amount of reflowable dielectric material that is adjacent the side edges of the gate fingers 134 after the reflow process is completed. A method of forming such a power semiconductor device is illustrated in FIGS. 9A-9D.

Figure 9A:
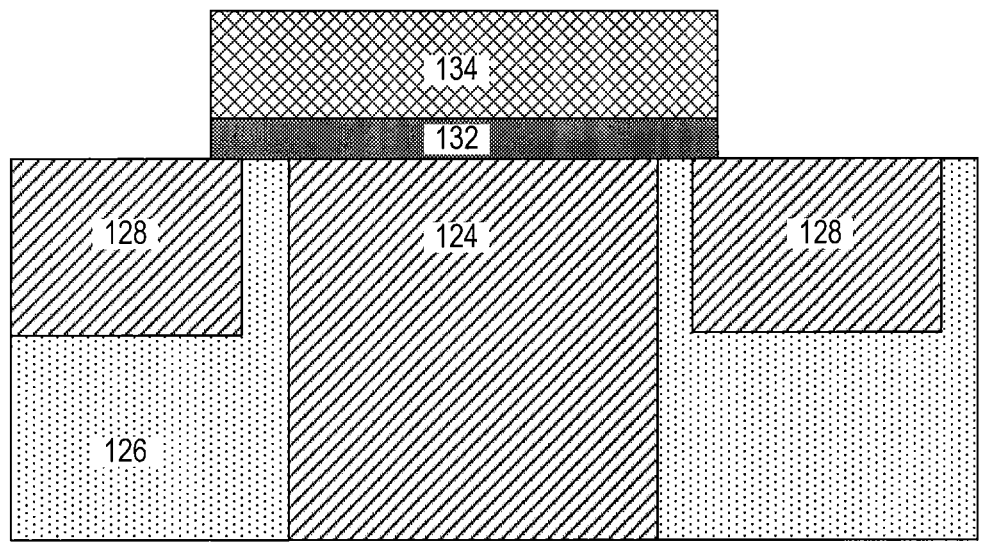
FIGS. 9A-9D are schematic cross-sectional diagrams that illustrate a method of forming a MOSFET according to further embodiments of the present invention.
Figure 9B:
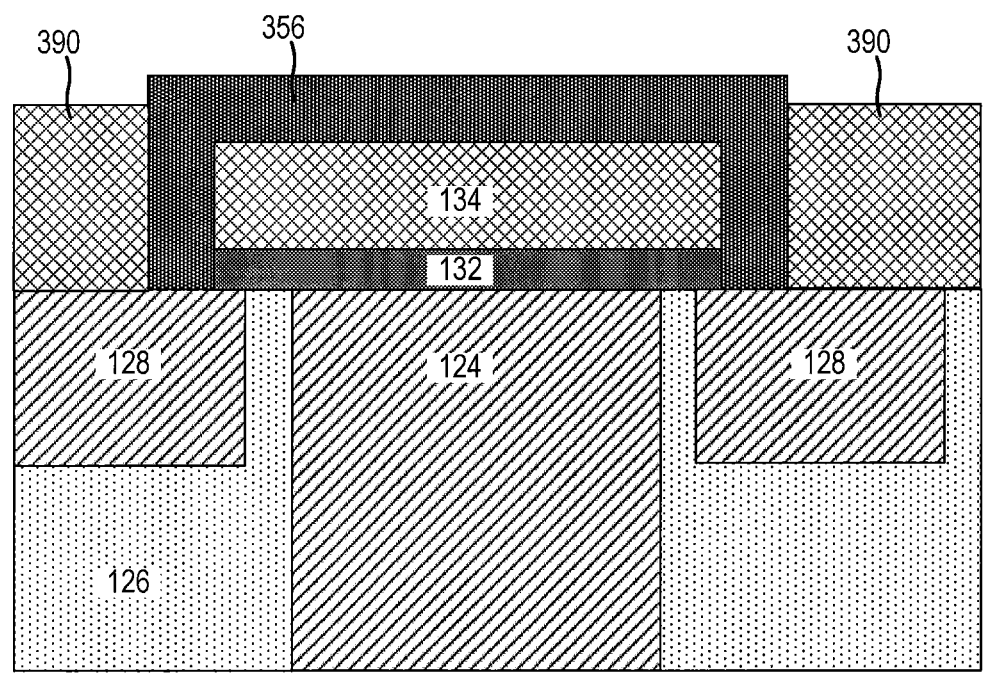

As shown in FIG. 9A, the semiconductor layer structure 120 may be formed having gate insulating fingers 132 and gate fingers 134 formed thereon. Referring to FIG. 9B, a reflowable dielectric layer (not shown) is formed to cover the upper surface of the device and is then etched to form a reflowable dielectric pattern 356 that comprises dielectric fingers that cover the top surface and side surfaces of the respective gate fingers 134 and the side surfaces of the respective gate insulating fingers 132. Next, sacrificial dams 390 are formed in the gaps 140. The sacrificial dams 390 may be selectively deposited in the gaps 140 or, alternatively, a sacrificial layer may be conformally formed on the top surface of the device and may then be selectively etched to form the sacrificial dams 390. The sacrificial dams 390 may comprise polysilicon in example embodiments, as polysilicon can be etched with high selectivity with respect to a BPSG reflowed dielectric pattern.

Figure 9C:
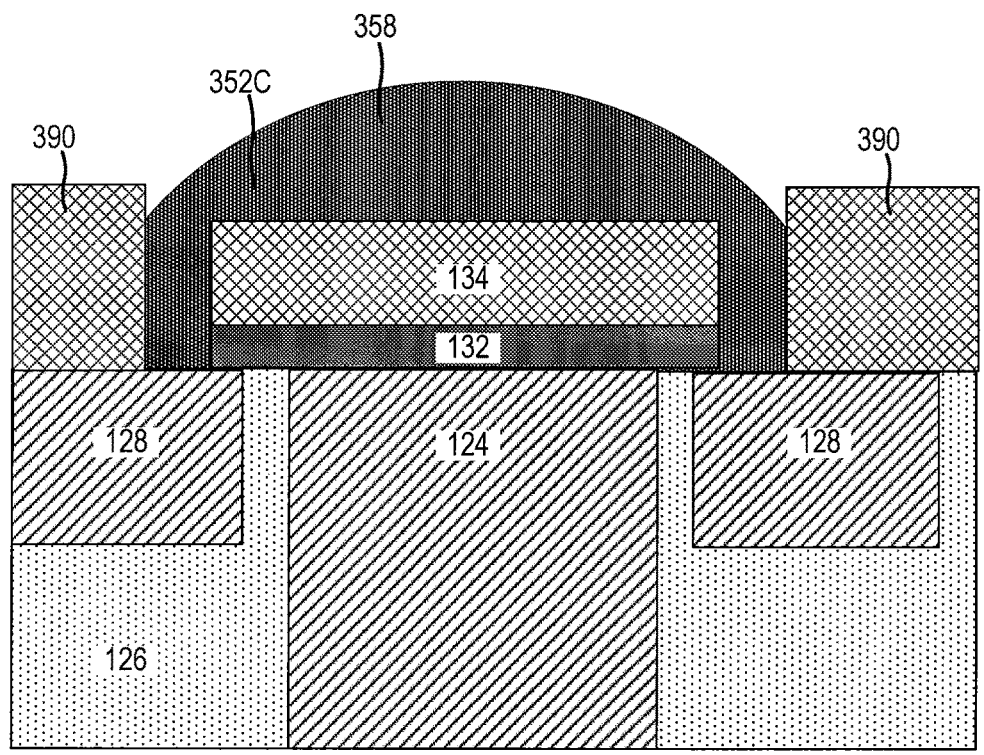
Figure 9D:
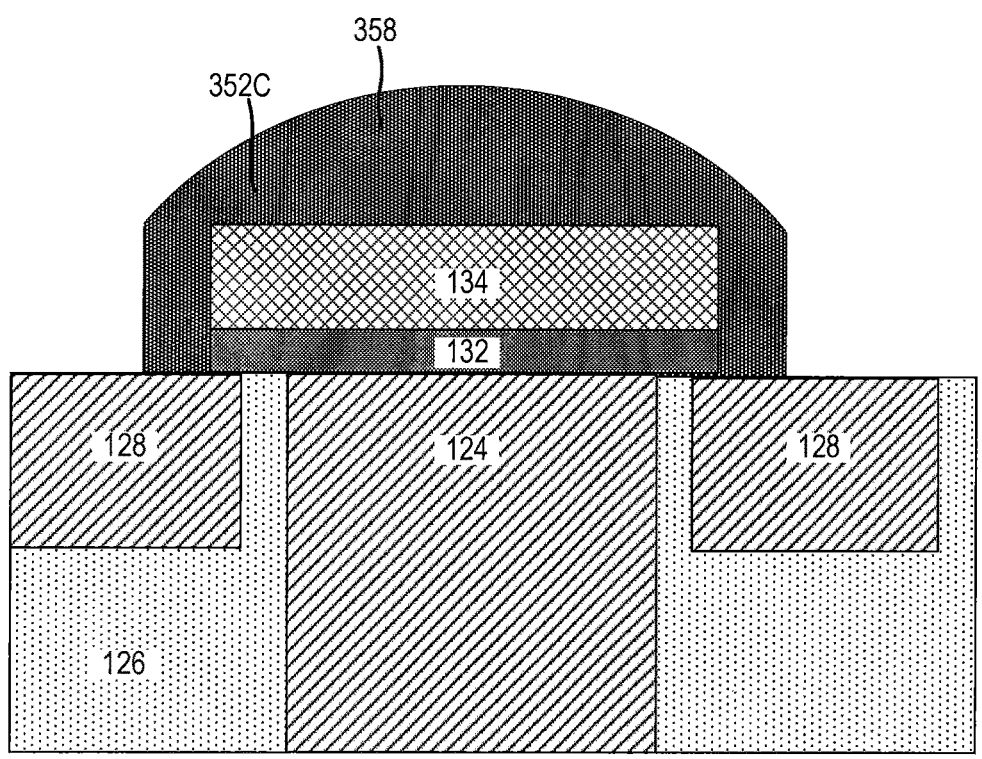

As shown in FIG. 9C, the device may then be heated to reflow the reflowable dielectric pattern 356, thereby converting the reflowable dielectric pattern 356 into a reflowed dielectric pattern 358 that includes a plurality of dielectric fingers 352C. As discussed above, such a reflow process generally causes the reflowable dielectric material to spread laterally and to change shape to have a semi-oval or semi-circular cross-section. However, the sacrificial dams 390 prevent the reflowable dielectric material from spreading laterally, and hence may maintain the size of the gaps 140. As such, the lower portion of the reflowed dielectric material pattern 358 has substantially vertical sidewalls, as shown in FIG. 9C. Additionally, since the reflowable dielectric material is prevented from spreading laterally, more reflowable dielectric material is maintained along the sidewalls of the gate fingers 134, which acts to increase the thickness of the dielectric fingers 352C along the side edges of the gate fingers 134. Thus, the use of the sacrificial dams 390 may reduce or prevent the two potential issues discussed above with reference to FIG. 3 that may arise when the inter-metal dielectric pattern 150 is formed using a reflowable dielectric material. Referring to FIG. 9D, after the reflow process is completed, the sacrificial dams 390 may be removed via a selective etch. It should be noted that while in the discussion above the sacrificial dams 390 are formed after the reflowable dielectric pattern 356 is formed, in other embodiments the sacrificial dams 390 may be formed before the reflowable dielectric pattern 356 is formed.

Figure 10:
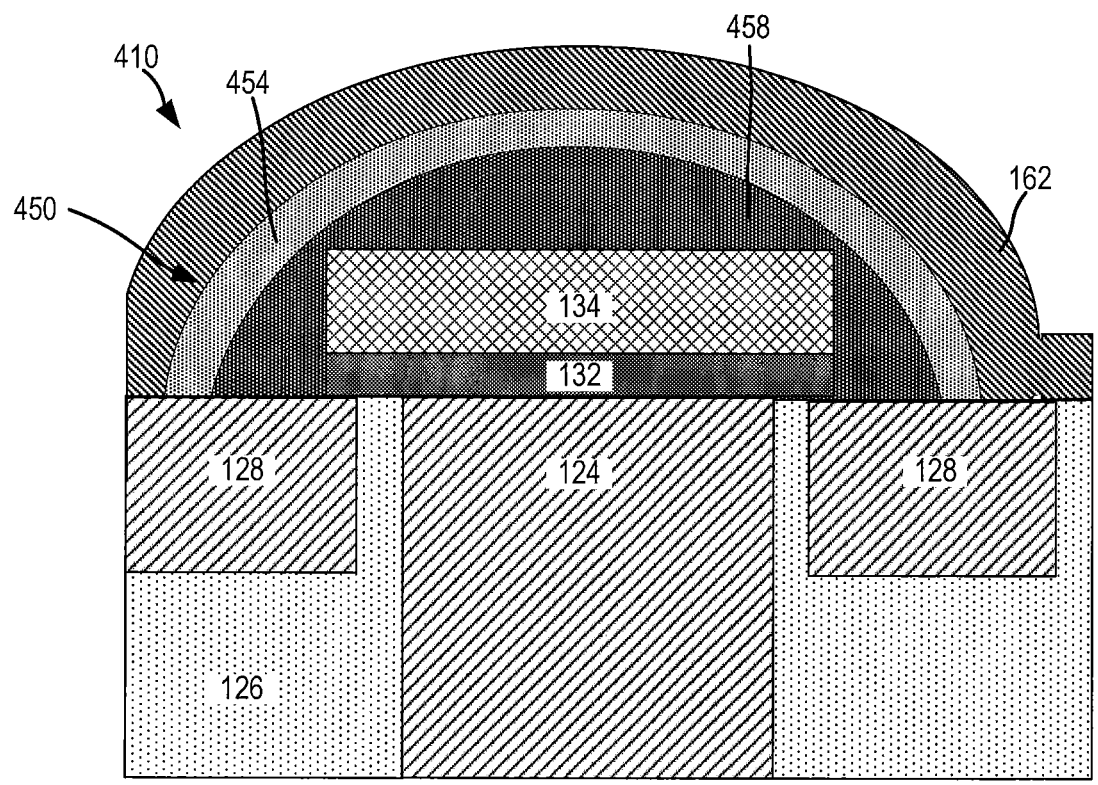
FIG. 10 is a cross-sectional view of a unit cell of a power MOSFET according to further embodiments of the present invention with the source metallization omitted.

In the discussion above of embodiments that include inter-metal dielectric patterns that have both a non-reflowable dielectric pattern and a reflowable dielectric pattern, the non-reflowable dielectric pattern is formed before the reflowable dielectric pattern so that the non-reflowable dielectric pattern is between the gate fingers and the reflowable dielectric pattern. It will be appreciated, however, that embodiments of the present invention are not limited thereto. In particular, each of the above-described embodiments that include inter-metal dielectric patterns that have both a non-reflowable dielectric pattern and a reflowable dielectric pattern could be modified so that the reflowable dielectric pattern (or layer) is formed first (e.g., directly on the gate fingers) and then reflowed, and then the non-reflowable dielectric pattern is formed on the reflowed dielectric pattern. By way of example, FIG. 10 is a schematic cross-section of a unit cell of a MOSFET 410 (with part of the source metallization thereof omitted) that is a revised version of the MOSFET 110 of FIGS. 5A-5E. As shown in FIG. 10, the inter-metal dielectric pattern 450 of MOSFET 410 includes a reflowed dielectric pattern 458 that is formed directly on the gate fingers 134 and a non-reflowable dielectric pattern 454 that is formed on the reflowed dielectric pattern 458.

While the MOSFETs discussed above are n-type devices with the source contact layer 164 on an upper surface thereof and the drain contact 116 on the bottom surface thereof, it will be appreciated that in p-type devices these locations are reversed. Moreover, while the above described power MOSFET 110 and the other devices described herein are shown as being silicon carbide based semiconductor devices, it will be appreciated that embodiments of the present invention are not limited thereto. Instead, the semiconductor devices may comprise any wide bandgap semiconductor that is suitable for use in power semiconductor devices including, for example, gallium nitride based semiconductor devices, gallium nitride based semiconductor devices and II-VI compound semiconductor devices.

It will also be appreciated that the non-reflowable and/or reflowable dielectric layers/patterns that form the inter-metal dielectric patterns discussed herein may each comprise a single layer or may be multilayer structures. In many applications, multilayer structures may be more effective either as a diffusion barrier and/or for providing chemical compatibility to surrounding layers.

It will also be appreciated that the improved inter-metal dielectric patterns disclosed herein may be used in power semiconductor devices other than vertical power MOSFET devices. For example, these inter-metal dielectric patterns may also be used in power IGBT devices, which, as known to those skilled in the art are the combination of a BJT and a MOSFET that feeds the base of the BJT in order to turn the BJT from a current controlled device into a voltage controlled device.

Figure 11A:
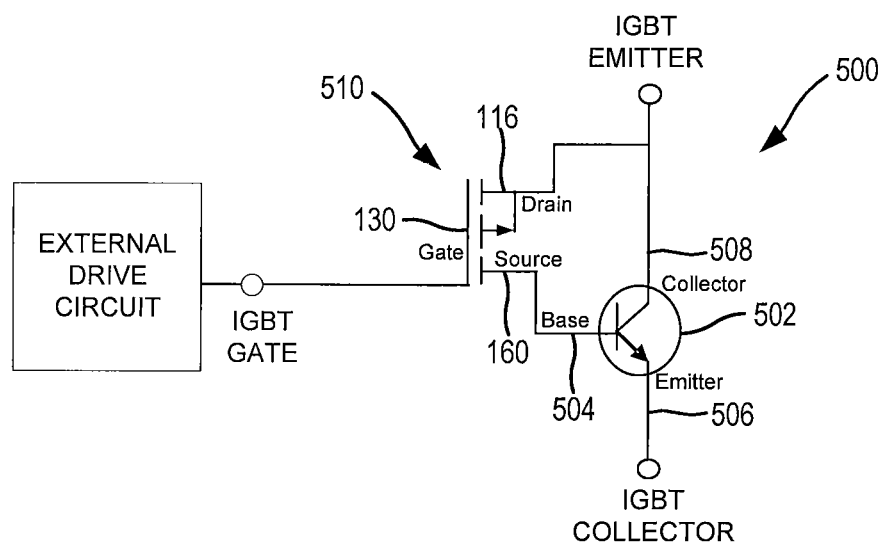
FIG. 11A is a simplified circuit diagram of an n-channel IGBT according to embodiments of the present invention.

FIG. 11A is a schematic cross-sectional diagram of a small portion of an IGBT 500 according to embodiments of the present invention. As shown in FIG. 11A, the IGBT 500 includes an p-n-p silicon carbide BJT 502 that has a base 504, an emitter 506 and a collector 508. The IGBT 500 further includes a silicon carbide MOSFET 510 having a gate 130, a source 160 and a drain 116. The source 160 of the MOSFET 510 is electrically connected to the base 504 of the BJT 502, and the drain 116 of the silicon carbide MOSFET 510 is electrically connected to the collector 508 of the BJT 502. By convention, the collector 508 of the BJT 502 is the "emitter" of the IGBT 500, and the emitter 506 of the BJT 502 is the "collector" of the IGBT 500, and the gate 130 of the MOSFET 510 is the "gate" of the IGBT 500.

Figure 11B:
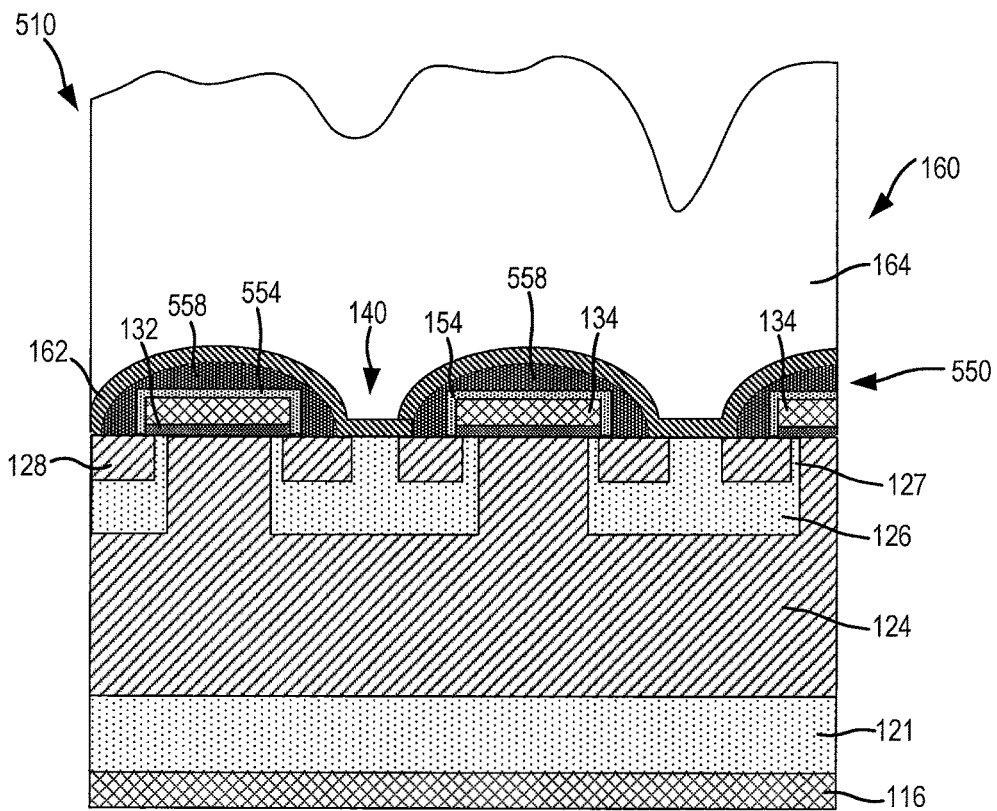
FIG. 11B is a schematic cross-sectional diagram of a pair of unit cells of the IGBT of FIG. 11A.

FIG. 11B is a schematic cross-sectional view of a small portion of the IGBT 500 of FIG. 11A. As shown in FIG. 11B, the IGBT 500 may be formed on, for example, a heavily-doped (p$^+$) p-type silicon carbide layer 121. The p-type layer 121 may, for example, be epitaxially grown on a silicon carbide substrate and the substrate may thereafter be removed. The p$^+$ layer 121 acts as the collector of the IGBT 500 (and hence also as the emitter 506 of the BJT 502). A lightly-doped n-type (n$^-$) silicon carbide drift region 124 is provided on the p-type layer 121 that acts as the base of the BJT 502 and as the source of the MOSFET 510. Moderately-doped p-type well regions 126 are provided in the upper portion of the n-type drift region 124. An upper portion of each p-well 126 may be more heavily doped with p-type dopants to form a heavily-doped p$^+$ emitter region which also acts as the collector of the BJT 502. Heavily-doped (n$^+$) n-type drain regions 128 may also be formed in upper portions of each p-well 126 that act as a common drain for the IGBT 500. A source metallization structure 160 is formed to contact both the p-type well regions 126 and the n$^+$ drain regions 128, and an ohmic contact 116 is formed on the lower side of the p$^+$ silicon carbide layer 121.

Gate insulating fingers 132 and gate fingers 134 are provided on the upper surface of the semiconductor layer structure. An inter-metal dielectric pattern 550 is formed that includes a first non-reflowable dielectric pattern 554 and a second reflowed dielectric pattern 558 (each of which are discussed in detail above). Gaps 140 are provided between adjacent dielectric fingers that expose the n-type source regions 128 and the p-type well regions 126. A top-side source metallization structure 160 is formed on the inter-metal dielectric pattern 550 and on the exposed n-type source regions 128 and p-type well regions 126. The top-side metallization structure 160 includes a diffusion barrier layer 162 and a source contact layer 164. It will be appreciated that the inter-metal dielectric pattern 550 may be replaced with any of the inter-metal dielectric patterns disclosed herein.

Figure 12:
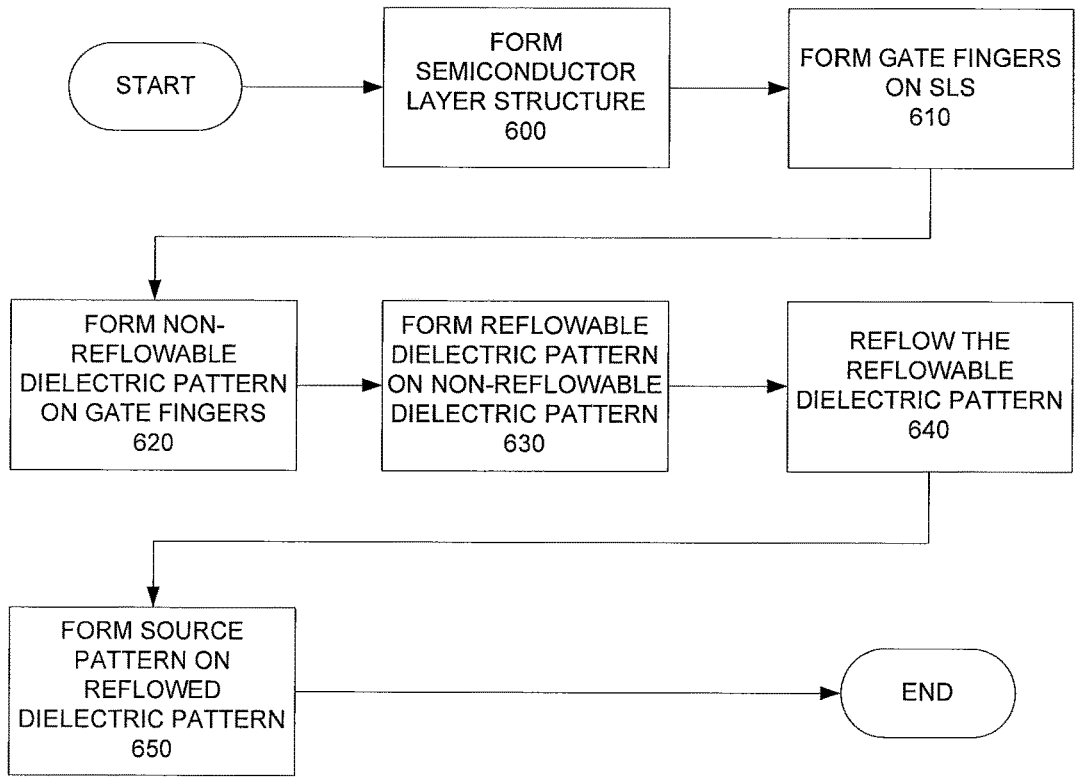
FIG. 12 is a flow chart of a method of forming a power MOSFET according to embodiments of the present invention.

FIG. 12 is a flow chart of a method of forming a power semiconductor device according to embodiments of the present invention. As shown in FIG. 12, operations may begin with the formation of a wide bandgap semiconductor layer structure ("SLS") that includes a plurality of semiconductor layers (Block 600). Next, a conductive pattern which may comprise, for example, a plurality of gate fingers, is formed on an upper surface of the wide bandgap semiconductor layer structure (Block 610). A first non-reflowable dielectric material pattern is formed on the conductive pattern (Block 620). A second reflowable dielectric material pattern is formed on the first non-reflowable dielectric material pattern (Block 630). The reflowable dielectric material pattern is reflowed to form an inter-metal dielectric pattern that includes the non-reflowable dielectric material pattern and a reflowed dielectric material pattern (Block 640). A source metallization structure is formed on the inter-metal dielectric pattern and on an exposed upper surface of the wide bandgap semiconductor layer structure (Block 650).

Figure 13:
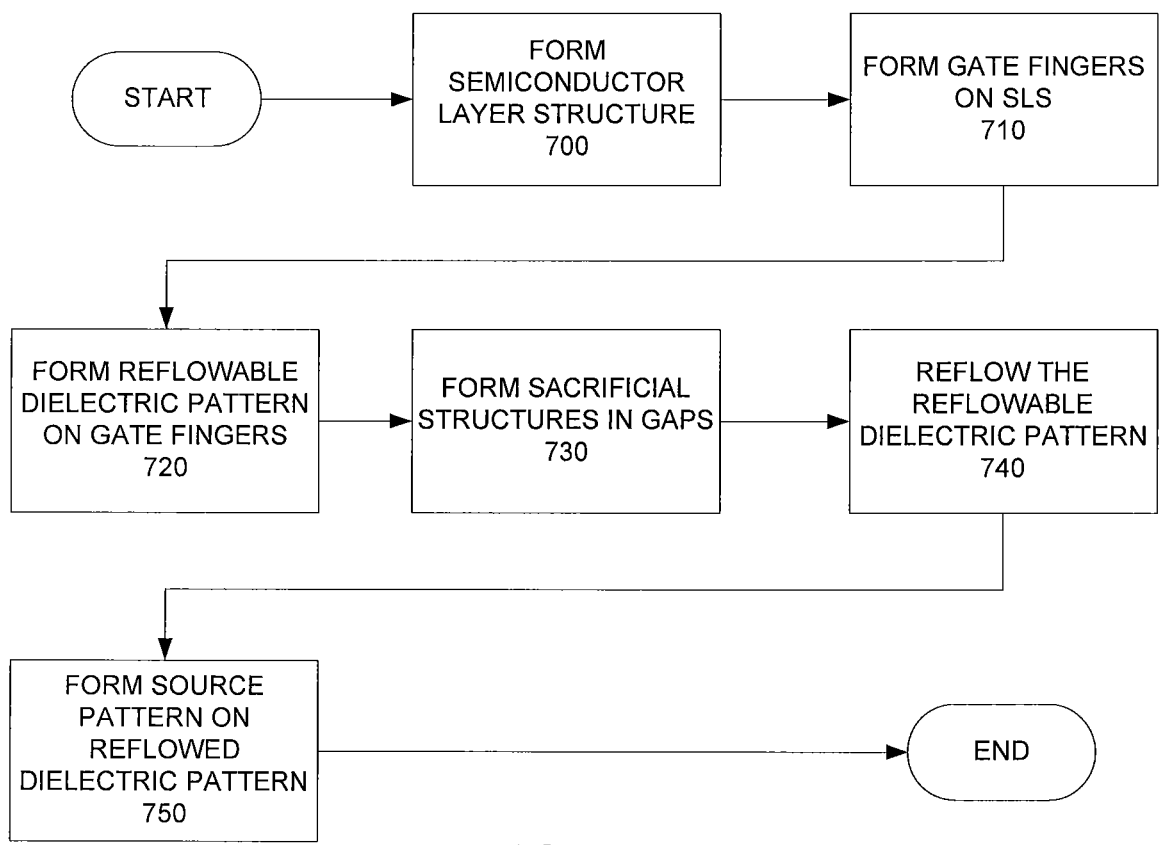
FIG. 13 is a flow chart of a method of forming a power MOSFET according to further embodiments of the present invention.

FIG. 13 is a flow chart of a method of forming a power semiconductor device according to further embodiments of the present invention. As shown in FIG. 13, operations may begin with the formation of a wide bandgap semiconductor layer structure that includes a plurality of semiconductor layers (Block 700). Next, a plurality of spaced-apart gate fingers are formed on an upper surface of the wide bandgap semiconductor layer structure (Block 710). A reflowable dielectric material pattern is formed on the gate fingers pattern (Block 720). Respective sacrificial structures are formed in respective gaps in the reflowable dielectric material pattern (Block 730). The reflowable dielectric material pattern is reflowed to form an inter-metal dielectric pattern (Block 740). A source metallization pattern is formed on the inter-metal dielectric pattern (Block 750).

Thus, pursuant to embodiments of the present invention, power MOSFETs may be provided that may be less susceptible to device failure due to gate-to-source electrical shorts due to the provision of inter-metal dielectric patterns that have improved profiles and increased density while still maintaining minimum desired thicknesses to avoid breakdown. These improved inter-metal dielectric patterns may be substantially free of seams that provide paths for moisture or wet etchants to diffuse through the inter-metal dielectric patterns, reducing the possibility of electrical short circuits between the gate and source metallization. As such, the power MOSFETs according to embodiments of the present invention may have lower failure rates.

The problem addressed by the techniques according to embodiments of the present invention tends to be a problem that is specific to wide bandgap power semiconductor devices such as silicon carbide and/or gallium nitride based devices, for example. In such devices, the gaps (e.g., gaps 140) between adjacent dielectric fingers (e.g., dielectric fingers 152) may be much smaller than the corresponding gaps that are provided in MOSFETs formed in narrow bandgap semiconductor devices such as silicon based devices. As such, in silicon MOSFETs voids in the source contact layer do not tend to form in the gaps between adjacent dielectric fingers and any keyholes that form tend to be much shallower due to the much larger size of the gaps. Thus, in narrow bandgap devices, wet etchants tend not to infiltrate through the source contact metallization, and hence the need for densifying the inter-metal dielectric pattern and/or rounding the profile thereof is reduced or eliminated.

It should be noted that there are other potential ways to address the problem of corrosive materials diffusing through the top-side source metallization structure 60 of the conventional power MOSFET 10 discussed above with reference to FIG. 1. As one example, the aspect ratio of the gaps 40 may be reduced by, for example, enlarging the width of the source regions 28. This may improve the gap fill characteristics of the top-side source metallization structure 60. As another example, changes in the deposition parameters may be used to improve the gap fill characteristics of the material of the source contact layer 64 (e.g., increased deposition temperature may facilitate improved gap fill). Moreover, the gap fill characteristics may also be improved by using a high precision deposition apparatus. Additionally, other deposition techniques such as, for example, atomic layer deposition could be used to form portions of the source metallization structure 160 (e.g., the portion in the gaps 40) in order to obtain more consistent coverage and to reduce or prevent voids.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor device, comprising:
   a wide bandgap semiconductor layer structure;
   a gate electrode structure on an upper surface of the wide bandgap semiconductor layer structure, the gate electrode structure comprising a gate finger that is separated from the wide bandgap semiconductor layer structure by a gate insulating finger that has a substantially uniform thickness in a direction that is perpendicular to a plane defined by the upper surface of the wide bandgap semiconductor layer structure;
   an inter-metal dielectric pattern on the gate electrode structure, the inter-metal dielectric pattern including a non-reflowable dielectric material pattern and a reflowed dielectric material pattern; and
   a source metallization structure on the inter-metal dielectric pattern,
   wherein the gate electrode structure is between the wide bandgap semiconductor layer structure and the inter-metal dielectric pattern,
   wherein the inter-metal dielectric pattern is between the gate electrode structure and the source metallization structure, and
   wherein a thickness of the reflowed dielectric material pattern above a center of the gate electrode structure is at least three times a thickness of the reflowed dielectric material pattern adjacent an upper side edge of the gate electrode structure.

2. The semiconductor device of claim 1, wherein the gate electrode structure comprises a plurality of gate fingers that are separated from the wide bandgap semiconductor layer structure by respective ones of a plurality of gate insulating fingers, and wherein the non-reflowable dielectric material pattern comprises a plurality of non-reflowable dielectric fingers that conformally surround upper and side surfaces of the respective gate fingers.

3. The semiconductor device of claim 1, wherein an upper surface of the reflowed dielectric material pattern has a semi-oval cross-section.

4. The semiconductor device of claim 1, wherein a thickness of the non-reflowable dielectric material pattern exceeds a minimum thickness of the reflowed dielectric material pattern and does not exceed a maximum thickness of the reflowed dielectric material pattern.

5. The semiconductor device of claim 4, wherein a portion of the reflowed dielectric material pattern that is adjacent an upper corner of the non-reflowable dielectric material pattern is a portion of the reflowed dielectric material pattern that has the minimum thickness.

6. The semiconductor device of claim 1, wherein the reflowed dielectric material pattern comprises a boro-phospho-silicate glass ("BPSG") pattern.

7. The semiconductor device of claim 4, wherein a ratio of a thickness of the reflowed dielectric material pattern above a center of the top surface of the gate finger of the gate electrode structure to the minimum thickness of the reflowed dielectric material pattern is more than 3 to 1.

8. The semiconductor device of claim 1, wherein a portion of the reflowed dielectric material pattern that is above the gate electrode structure has a semi-oval upper surface, and wherein the reflowed dielectric material pattern has vertical outer sidewalls.

9. The semiconductor device of claim 1, wherein a minimum thickness of the non-reflowable dielectric material pattern is selected to be sufficient to avoid breakdown of the inter-metal dielectric pattern during normal operation of the semiconductor device.

10. A semiconductor device, comprising:
    a wide bandgap semiconductor layer structure;
    a gate electrode structure on an upper surface of the wide bandgap semiconductor layer structure;
    an inter-metal dielectric pattern on the gate electrode structure, the inter-metal dielectric pattern comprising a reflowed dielectric material pattern and a non-reflowable dielectric material pattern that is on the reflowed dielectric material pattern: and
    a source metallization structure on the inter-metal dielectric pattern,
    wherein an upper surface of the reflowed dielectric material pattern has a semi-oval cross-section, and
    wherein a thickness of the reflowed dielectric material pattern above a center of the gate electrode structure is at least three times a thickness of the reflowed dielectric material pattern adjacent an upper side edge of the gate electrode structure.

11. The semiconductor device of claim 10, wherein the gate electrode structure comprises a plurality of gate fingers that are separated from the wide bandgap semiconductor layer structure by respective ones of a plurality of gate insulating fingers.

12. The semiconductor device of claim 10, wherein the gate electrode structure is between the wide bandgap semiconductor layer structure and the inter-metal dielectric pattern, and wherein the inter-metal dielectric pattern is between the gate electrode structure and the source metallization structure.

13. The semiconductor device of claim 10, wherein a ratio of a thickness of the inter-metal dielectric pattern above a center of a top surface of a gate finger of the gate electrode structure to a minimum thickness of the inter-metal dielectric pattern is less than 4-to-1.

14. The semiconductor device of claim 10, wherein the non-reflowable dielectric material pattern is between the reflowed dielectric material pattern and the source metallization structure, and an upper surface of the non-reflowable dielectric material pattern has a semi-oval cross-section.

15. The semiconductor device of claim 10, wherein the upper surface of the reflowed dielectric material pattern and an upper surface of the non-reflowable dielectric pattern each have a semi-oval cross-section.

16. A semiconductor device, comprising:
a wide bandgap semiconductor layer structure;
a gate electrode structure on an upper surface of the wide bandgap semiconductor layer structure;
an inter-metal dielectric pattern on the gate electrode structure, the inter-metal dielectric pattern including at least a first reflowed dielectric material pattern and a second non-reflowable dielectric material pattern that comprises a different material than the first reflowed dielectric material pattern; and
a source metallization structure on the inter-metal dielectric pattern,
wherein the gate electrode structure is between the wide bandgap semiconductor layer structure and the inter-metal dielectric pattern,
wherein the inter-metal dielectric pattern is between the gate electrode structure and the source metallization structure, and
wherein the second non-reflowable dielectric material pattern has a thickness that exceeds a minimum thickness of the first reflowed dielectric material pattern and does not exceed a maximum thickness of the first reflowed dielectric material pattern.

17. The semiconductor device of claim 16, wherein the first reflowed dielectric material pattern has a rounded semi-oval upper surface and vertical outer sidewalls.

18. The semiconductor device of claim 16, wherein an upper surface of the first reflowed dielectric material pattern and an upper surface of the second non-reflowable dielectric material pattern each have a semi-oval cross-section.

* * * * *

UNITED STATES PATENT AND TRADEMARK OFFICE
CERTIFICATE OF CORRECTION

PATENT NO. : 10,998,418 B2
APPLICATION NO. : 16/413921
DATED : May 4, 2021
INVENTOR(S) : Van Brunt et al.

Page 1 of 1

It is certified that error appears in the above-identified patent and that said Letters Patent is hereby corrected as shown below:

In the Specification

Column 8, Line 47:
Delete "at and $\alpha_2$" insert -- $\alpha_1$ and $\alpha_2$ --

Column 8, Line 62:
Delete "SOA" insert -- 50A --

In the Claims

Column 26, Lines 21-22, Claim 17:
Delete "a rounded semi-oval" insert -- a semi-oval --

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*